(12) United States Patent
Tanaka et al.

(10) Patent No.: US 7,473,495 B2
(45) Date of Patent: Jan. 6, 2009

(54) METHOD OF CREATING PREDICTIVE MODEL, METHOD OF MANAGING PROCESS STEPS, METHOD OF MANUFACTURING SEMICONDUCTOR DEVICE, METHOD OF MANUFACTURING PHOTO MASK, AND COMPUTER PROGRAM PRODUCT

(75) Inventors: Satoshi Tanaka, Kawasaki (JP); Soichi Inoue, Yokohama (JP); Koji Hashimoto, Yokohama (JP); Shigeru Hasebe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 714 days.

(21) Appl. No.: 10/927,218

(22) Filed: Aug. 27, 2004

(65) Prior Publication Data

US 2005/0089768 A1    Apr. 28, 2005

(30) Foreign Application Priority Data

Aug. 28, 2003  (JP) ............................. 2003-209310
Aug. 20, 2004  (JP) ............................. 2004-240883

(51) Int. Cl.
*G03F 9/00* (2006.01)
(52) U.S. Cl. ................................ 430/5; 430/30; 716/19; 716/20; 716/21
(58) Field of Classification Search ..................... 430/5, 430/30; 716/19–21
See application file for complete search history.

(56) References Cited

U.S. PATENT DOCUMENTS 6,928,636 B2 * 8/2005 Ohnuma ...................... 716/21

2005/0251781 A1* 11/2005 Kotani et al. .................. 716/19
2007/0100591 A1*  5/2007 Harazaki ....................... 703/2

FOREIGN PATENT DOCUMENTS

JP         11-102062         4/1999
JP         2002-311563      10/2002

OTHER PUBLICATIONS

Stirniman, J. P. et al., "Fast Proximity Correction with Zone Sampling", SPIE, vol. 2197, pp. 294-301, (1994).
Notification of Reasons for Rejection from the Japanese Patent Office, mailed Oct. 30, 2007, in Japanese Patent Application No. 2004-240883 and English translation thereof.
Toshiya Kotani et al., "Highly Accurate Process Proximity Correction Based on Empirical Model for 0.18 µm Generation and Beyond", Jpn. J. Appl. Phys., vol. 38, 1999, pp. 6957-6962.

* cited by examiner

Primary Examiner—Christopher G Young
(74) Attorney, Agent, or Firm—Finnegan, Henderson, Farabow, Garrett & Dunner, L.L.P.

(57) ABSTRACT

A method of creating a predictive model of a process proximity effect comprises: preparing a predictive model of a process proximity effect including a non-determined parameter; and determining the non-determined parameter, the method comprises: preparing a pattern group for modeling, the pattern group comprising a plurality of repetition patterns, the plurality of repetition patterns being obtained by changing a first and second dimensions of a repetition pattern which repeats a basic pattern, the first dimension defining the basic pattern, and the second dimension defining repetition of the basic pattern; selecting a predetermined repetition pattern from the pattern group for modeling, the basic pattern of the predetermined repetition pattern corresponding to a pattern which is to be formed on a wafer and has a predetermined dimension; and determining the non-determined parameter in the predictive model based on the predetermined repetition pattern and the pattern having the predetermined dimension.

24 Claims, 16 Drawing Sheets

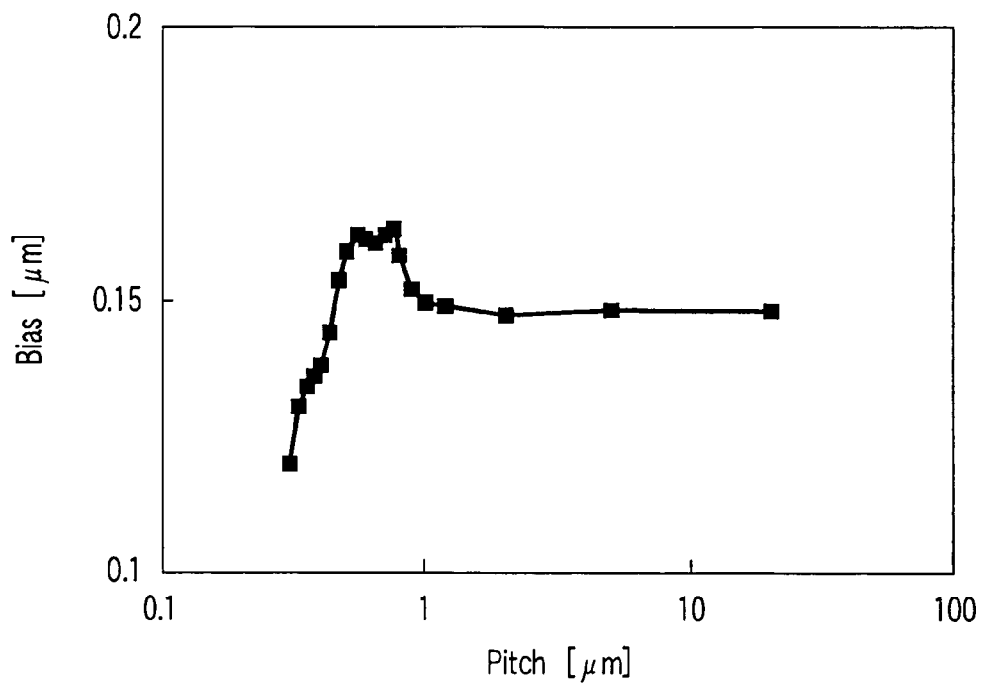
F I G. 4
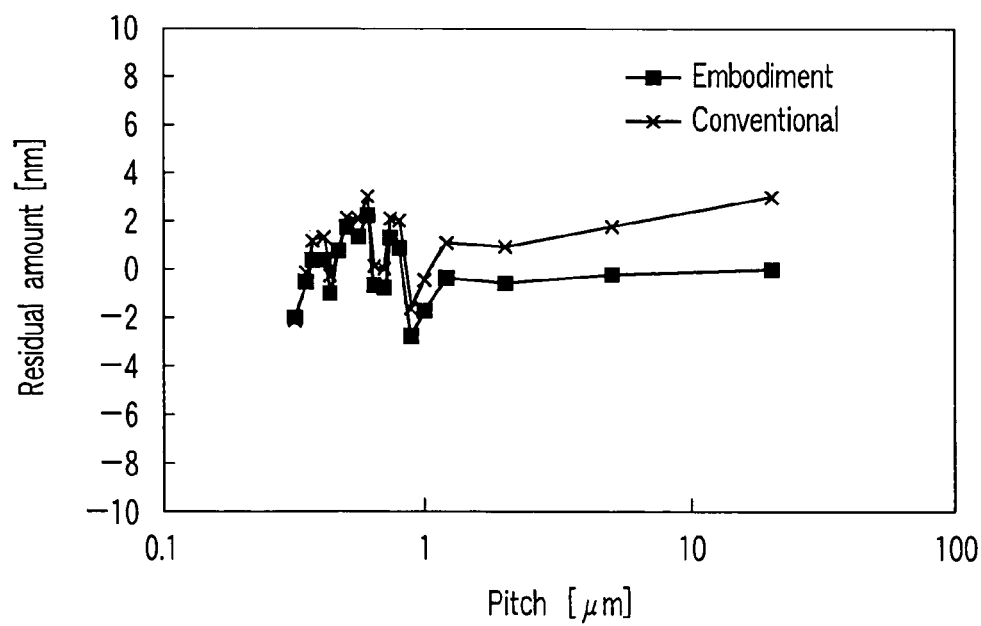
F I G. 5

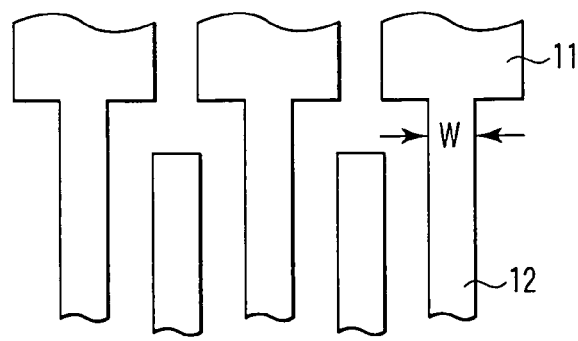
F I G. 7
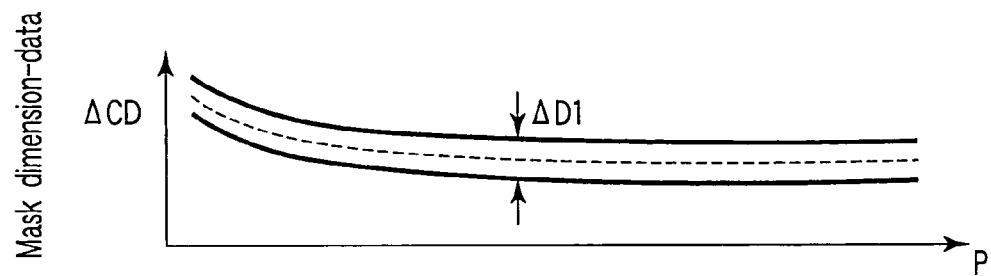
F I G. 8 A
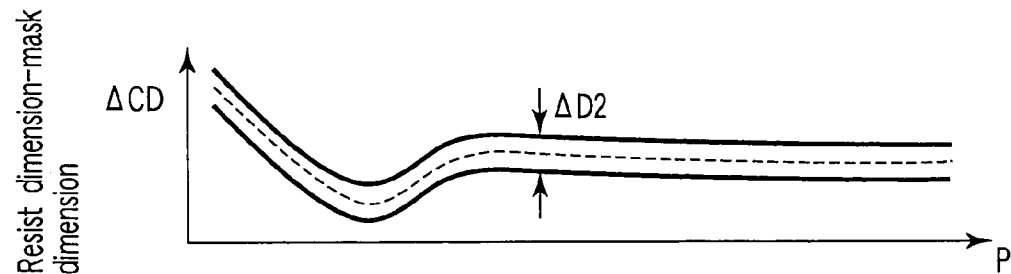
F I G. 8 B
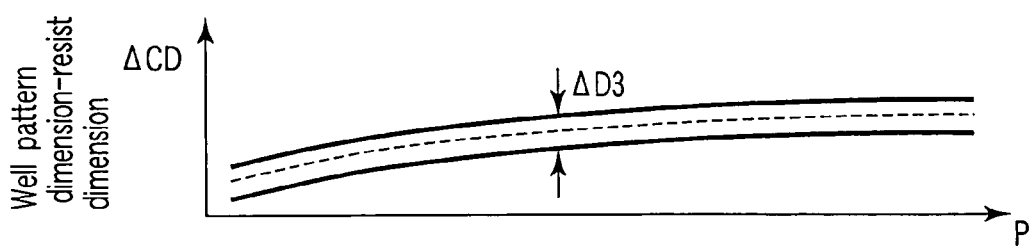
F I G. 8 C σA = 1.11nm, σB = 0.53nm, σtotal = 1.24nm, correlation coefficient = 0.015, $\sqrt{(\sigma A^2 + \sigma B^2)}$ = 1.23nm σA = 0.97nm, σB = 0.52nm, σtotal = 1.25nm, correlation coefficient = 0.35, $\sqrt{(\sigma A^2 + \sigma B^2)}$ = 1.10nm

METHOD OF CREATING PREDICTIVE MODEL, METHOD OF MANAGING PROCESS STEPS, METHOD OF MANUFACTURING SEMICONDUCTOR DEVICE, METHOD OF MANUFACTURING PHOTO MASK, AND COMPUTER PROGRAM PRODUCT

CROSS-REFERENCE TO RELATED APPLICATIONS

This application is based upon and claims the benefit of priority from the prior Japan Patent Applications No. 2003-209310, Aug. 28, 2003, and Japan Patent Applications No. 2004-240883, Aug. 20, 2004, the entire contents of both of which are incorporated herein by reference.

BACKGROUND OF THE INVENTION

1. Field of the Invention

The present invention relates to a method of creating a predictive model for use in process proximity effect correction, a method of managing process steps, a method of manufacturing a semiconductor device, a method of manufacturing a photo mask, and a computer program product.

2. Description of the Related Art

In recent years, with miniaturization of LSI, a pattern on a photo mask (mask pattern), having a dimension below 1 μm, has been required. By the miniaturization of the mask pattern, phenomena in which a resist pattern cannot be formed as designed on a wafer in a lithography step, that is, optical proximity effects (OPE) become obvious.

To suppress an influence of the OPE, a technique of forming the resist pattern as designed by use of a corrected photo mask, that is, optical proximity correction (OPC) is performed. Introduction of the OPC makes it possible to suppress fluctuations of a critical dimension (CD) on the wafer, and even a finer pattern can be finished faithfully as designed on the wafer.

Moreover, in recent years, phenomena in which a mask pattern cannot be formed on the photo mask as designed in accordance with mask drawing data in a step of manufacturing a photo mask and in which a pattern cannot be formed on the wafer as designed in accordance with the resist pattern in a processing step, that is, so-called process proximity effects (PPE) have become obvious.

To suppress the influence of the PPE, a technique of correcting a conversion difference through steps including the photo mask manufacturing step to the processing step, that is, a process proximity correction (PPC) has been performed.

There is one type of the PPC in which a finally obtained dimension of the pattern on the wafer is directly predicted from the mask drawing data using a process proximity effect predictive model, a conversion difference between the mask drawing data and the pattern on the wafer is estimated, and the finally obtained dimension is corrected (Proc. SPIE Vol. 3677 pl. 722 to 733, Stirnimann et. al).

Moreover, there is another PPC in which each conversion difference between the steps is estimated using predictive models prepared for each of the photo mask manufacturing step, lithography step, and processing step, and the dimension is corrected for each step (Jpn. Pat. Appln. KOKAI Publication No. 11-102062).

The predictive models are used in these PPCs as described above. A method of creating the predictive model has a step of preparing the mask drawing data corresponding to a plurality of repetition patterns to acquire the finally obtained dimension of the pattern on the wafer corresponding to the mask drawing data by experiments and a step of determining non-determined parameters in the predictive model by fitting by use of the mask drawing data and the finally obtained dimension.

As the mask drawing data, for example, as shown in FIG. 9, data corresponding to a plurality of line & space patterns having different pitches (=P1 to P8) are prepared. A line width is constant (=W1).

FIG. 10 shows a relation between the pitches P1 to P8 obtained by a conventional predictive model and the CDs of the finished line & space patterns on the wafer. Here, the CD is a width of the line pattern on the wafer.

The pitch of the line & space pattern of FIG. 10, that is, a pitch of the line & space pattern for an experiment does not necessarily match that of an actually used line & space pattern. A CD value corresponding to a pitch other than the pitch of the line & space pattern for use in the experiment is obtained by extrapolation. However, it is difficult to verify precision of the CD value obtained by the extrapolation. Therefore, there occurs a case that a prediction precision in an actually required pitch drops.

Moreover, as a result of the drop of the prediction precision in the actually required pitch, it is difficult to set a target of an allowable fluctuation amount of a process in a case where the process is managed in consideration of the PPE in each step. That is, it is difficult to manage steps of manufacturing a semiconductor from a viewpoint of the PPE.

BRIEF SUMMARY OF THE INVENTION

According to an aspect of the present invention, there is provided a method of creating a predictive model of a process proximity effect comprising: preparing a predictive model of a process proximity effect including a non-determined parameter; and determining the non-determined parameter, the method comprising: the method comprising: preparing a pattern group for modeling, the pattern group comprising a plurality of repetition patterns, the plurality of repetition patterns being obtained by changing a first and second dimensions of a repetition pattern which repeats a basic pattern, the first dimension defining the basic pattern, and the second dimension defining repetition of the basic pattern; selecting a predetermined repetition pattern from the pattern group for modeling, the basic pattern of the predetermined repetition pattern corresponding to a pattern which is to be formed on a wafer and has a predetermined dimension; and determining the non-determined parameter in the predictive model based on the predetermined repetition pattern and the pattern having the predetermined dimension.

According to an aspect of the present invention, there is provided a method of managing process steps comprising: selecting predetermined mask drawing data corresponding to a predetermined repetition pattern from mask drawing data, the mask drawing data corresponding to a pattern group for modeling, the pattern group comprising a plurality of repetition patterns, the repetition patterns being obtained by changing a first and second dimensions of a repetition pattern which repeats a basic pattern, the first dimension defining the basic pattern, and the second dimension defining repetition of the basic pattern, and the predetermined repetition pattern including a basic pattern corresponding to a pattern which is to be formed on a wafer and has a predetermined dimension; and judging whether or not a dimension difference between an actual dimension of a portion of a photo mask corresponding to the predetermined mask drawing data and a target dimension falls in a first allowable range in a photo mask manufacturing step, judging whether or not a dimension difference between an actual dimension of a portion of a photo resist corresponding to the predetermined mask drawing data and a target dimension falls in a second allowable range in a lithography step, and judging whether or not a dimension difference between an actual dimension of a portion of a pattern on the wafer corresponding to the predetermined mask drawing data and a target dimension falls in a third allowable range in a processing step.

According to another aspect of the present invention, there is provided a method of managing process steps comprising: preparing a pattern group comprising a plurality of repetition patterns, the plurality of repetition patterns being obtained by changing a first and second dimensions of a repetition pattern which repeats a basic pattern, the first dimension defining the basic pattern, and the second dimension defining repetition of the basic pattern; selecting at least one repetition patterns from the pattern group; obtaining a first difference which is a difference between an actual value and a target value of a control value of a first step relating to a forming of the selected at least one repetition patterns; and setting a first allowable range which is an allowable range of the first difference based on a predetermined second allowable range, the second allowable range being an allowable range between an actual value and a target value of a control value of a second step relating to a forming of the selected at least one repetition patterns, the forming being performed after the first step.

According to another aspect of the present invention, there is provided a method of managing process steps comprising: preparing a pattern group comprising a plurality of repetition patterns, the plurality of repetition patterns being obtained by changing a first and second dimensions of a repetition pattern of a basic pattern, the first dimension defining the basic pattern, and the second dimension defining repetition of the basic pattern; selecting at least one repetition pattern from the pattern group; obtaining a first difference which is a difference between an actual value and a target value of a control value of a step of forming mask drawing data relating to a forming of the selected at least one repetition patterns; obtaining a second difference which is a difference between an actual value and a target value of a control value of a step of manufacturing a photo mask relating to a forming of the selected at least one repetition patterns; obtaining a first ratio which is a ratio of the second difference to the first difference; setting a first allowable range which is an allowable range of the first difference based on the first ratio and a predetermined second allowable range which is an allowable range of the second difference; obtaining a third difference which is a difference between an actual value and a target value of a control value of a lithography step relating to a forming of the selected at least one repetition patterns; obtaining a second ratio which is a ratio of the third difference to the second difference; setting a second allowable range which is an allowable range of the second difference based on the second ratio and a predetermined third allowable range which is an allowable range of the third difference; obtaining a fourth difference which is a difference between an actual value and a target value of a control value of a processing step relating to a forming of the selected at least one repetition patterns; obtaining a third ratio which is a ratio of the fourth difference to the third difference; setting a third allowable range which is an allowable range of the third difference based on the third ratio and a preset fourth allowable range which is an allowable range of the fourth difference; and setting a fourth allowable range which is an allowable range of the difference between the actual value and the target value of the processing step.

According to an aspect of the present invention, there is provided a method of manufacturing a semiconductor device comprising: managing process steps of manufacturing the semiconductor device by a method of managing process steps according to an aspect of the present invention and performing the managed manufacturing step.

According to an aspect of the present invention, there is provided a method of manufacturing a photo mask, comprising:

managing process steps of manufacturing the photo mask by a method of managing process steps according to an aspect of the present invention and performing the managed manufacturing steps.

According to an aspect of the present invention, there is provided a computer program product configured to store program instructions for execution on a computer system enabling the computer system to perform: inputting a step; and managing the step by a method of managing process steps according to an aspect of the present invention.

BRIEF DESCRIPTION OF THE SEVERAL VIEWS OF THE DRAWING

FIG. 4 is a diagram showing combinations of the pitches and biases corresponding to a pattern having a predetermined line width in the pattern on the wafer obtained by exposing the pattern group for modeling of FIG. 2;

FIG. 5 is a diagram showing results of comparison of a prediction precision of a predictive model of the embodiment with that of a conventional predictive model;

FIG. 7 is a plan view showing an example of a pattern having a largest fluctuation in each step;

FIGS. 8A to 8C are explanatory views showing a method of managing a semiconductor manufacturing step according to the second embodiment of the present invention;

DETAILED DESCRIPTION OF THE INVENTION

Embodiments of the present invention will be described hereinafter with reference to the drawings.

First Embodiment

Figure 1:
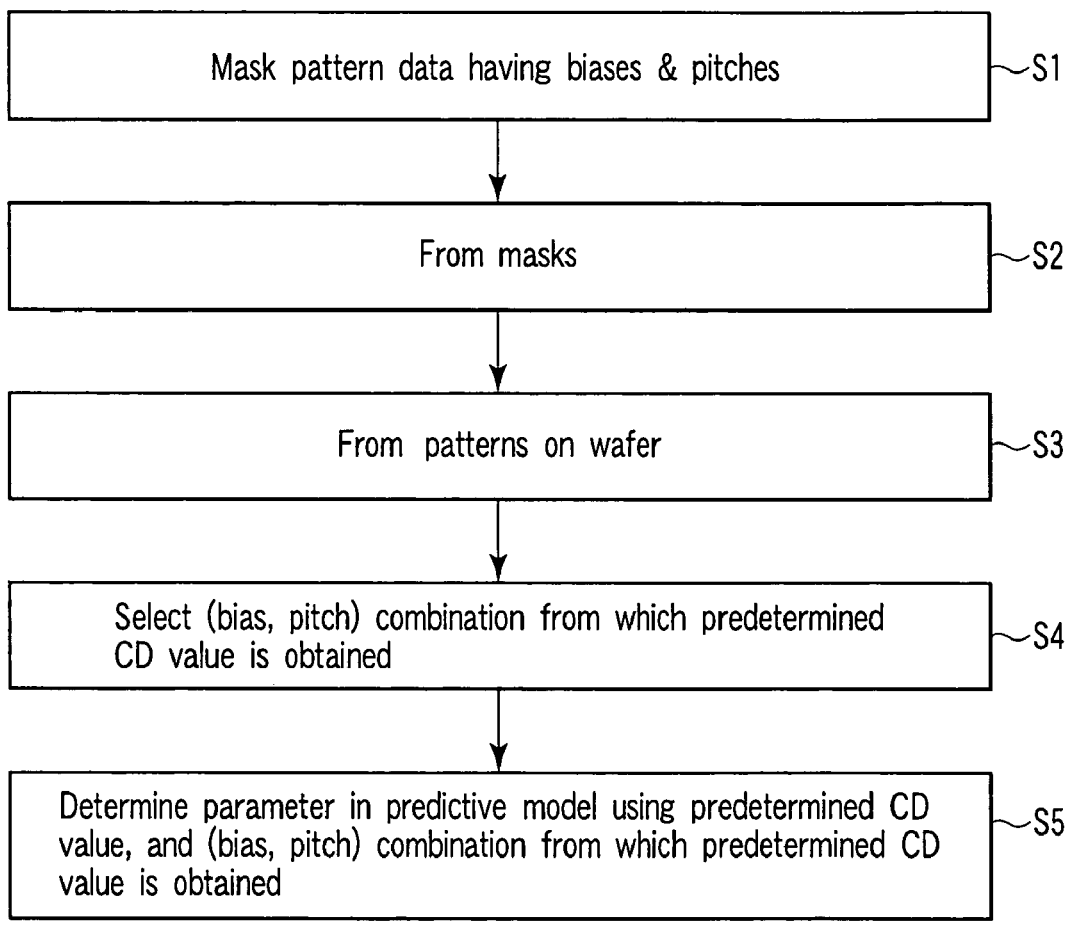
FIG. 1 is a flowchart showing a method of creating a process proximity effect predictive model according to the first embodiment of the present invention.

FIG. 1 is a flowchart showing a method of creating a process proximity effect predictive model (hereinafter referred to simply as the predictive model) according to a first embodiment of the present invention. Here, a method of creating the predictive model will be described which is of such a type that a finally obtained dimension of a pattern on a wafer is directly predicted from mask drawing data.

First, the mask drawing data (mask pattern data) is prepared corresponding to a pattern group for modeling which comprises a plurality of line & space patterns obtained by changing line widths (biases) of line patterns and pitches of the line & space patterns with respect to a line & space patterns which comprises repetition line patterns (step S1).

Figure 2:
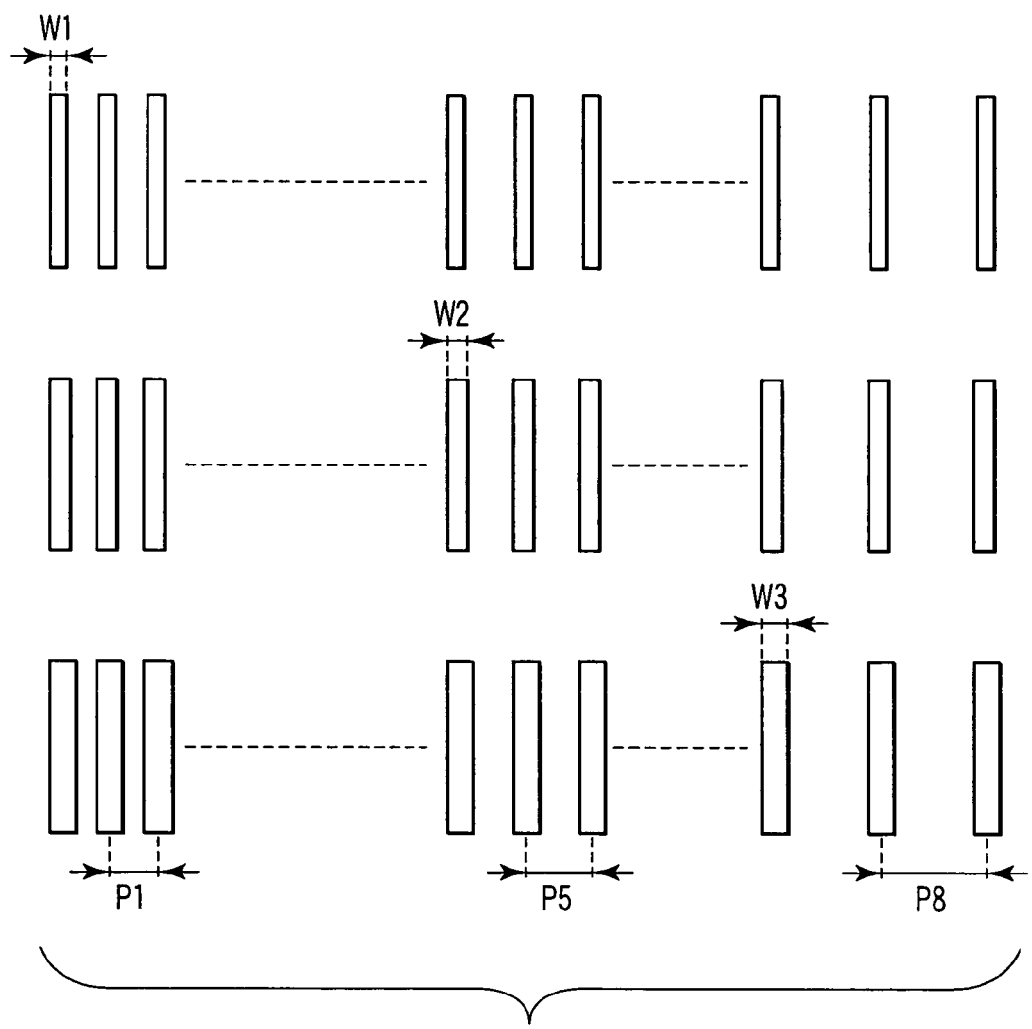
FIG. 2 is a diagram showing a concrete example of a pattern group for modeling in the embodiment.

Here, the line & space pattern group shown in FIG. 2 are used as the pattern group for modeling. There are three types of line widths (biases) W1 to W3. There are eight types of pitches P1 to P8. Therefore, the mask drawing data (mask pattern data) corresponding to 24 types of the line & space patterns is prepared. The number of the types of the line widths and the number of the types of the pitches are not limited to those in the above-described example.

Next, 24 types of photo masks corresponding to the pattern group for modeling are formed (step S2).

Next, a lithography step including an exposing process, a developing process and the like using the photo masks formed in the step S2 is performed to form a resist pattern. Thereafter, a processing step including a process of etching a substrate film (e.g., a polysilicon film) precedently formed on a wafer using the resist pattern is performed to form line & space patterns on the wafer (step S3). The number of the types of the line & space patterns formed on the wafer is 24 corresponding to the types of the photo masks.

Figure 3:
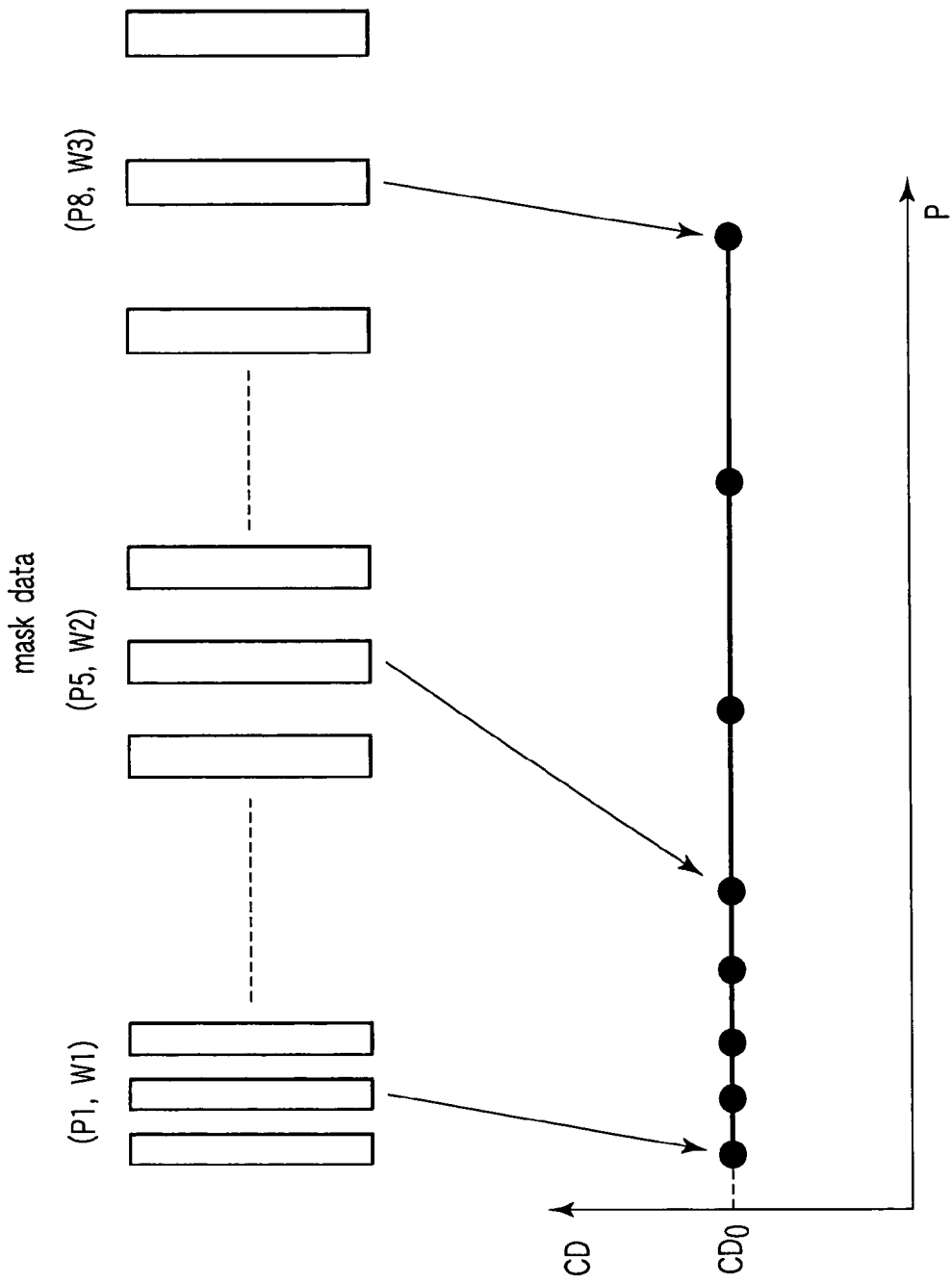
FIG. 3 is a diagram showing combinations of pitches and biases corresponding to a pattern having a predetermined CD value on a wafer.

Next, as shown in FIG. 3, a combination ((P1, W1), . . . , (P5, W2), . . . , (P8, W3) in FIG. 3) of the pitch and the bias (the line width herein) of the line & space pattern having a predetermined CD value=$CD_0$ (predetermined line width herein) on the wafer is selected from 24 line & space patterns formed on the wafer (step S4).

Next, an appropriate model is selected from known predictive models. The predictive model includes a non-determined parameter. Next, the parameter in the selected predictive model is determined by known fitting using the data of the mask pattern having the acquired combination of the pitch and bias as an input value and using the predetermined CD value (=$CD_0$) as an output value (step S5).

The line width (bias) of the line & space pattern having the pitch which is not in the pattern group for modeling on the wafer is predicted using the predictive model obtained in this manner, a conversion difference is estimated, and mask pattern date can be corrected (OPC) so that desired finally obtained dimension is obtained. The line width is, for example, a width of a gate electrode (gate wiring) of a MOS transistor in LSI.

A concrete example of a method of creating the predictive model of the present embodiment will be described hereinafter.

Exposure conditions are as follows:

exposure wavelength (λ)=193 nm;

numerical aperture (NA)=0.55;

coherence factor (σ)=0.82;

annular illumination (central shielding ratio=2/3);

resist (300 mm thick)/anti-reflective coating (ARC) (80 nm thick)/Si (wafer);

attenuated phase shift mask (intensity transmittance of 6%, phase difference of 180 degrees); and exposure dose setting: 140 nm isolated line (mask) →140 nm isolated line (resist).

The pattern group for modeling for use is as follows: (all dimension described below is translated on wafer dimension, in other words, divided by Exposure Tool's magnification factor (which typically 4 or 5)

reference mask line width: 140 nm;

types of biases (line widths): 81 types (bias increment amount=0.625 nm; set to a minimum data grid drawable by a mask drawing apparatus×2); and types of pitches: 20 types (300 nm to 20 μm).

The combination of the pitch and bias of the line & space pattern having a line width of 140 nm is selected from the plurality of line & space patterns on the wafer obtained by exposing the pattern for modeling on the above-described exposure conditions.

FIG. 4 shows the selected combination of the pitch and bias. The bias of FIG. 4 is a mask line width by conversion on the wafer.

The mask drawing data corresponding to the line & space pattern having the selected combination of the pitch and bias is modeled by a multi-Gaussian function proposed by Kotani et al. in JJAP Vol. 38 (1999) pp. 6957 to 6962.

First, an image intensity distribution I(x) on the resist obtained by the lithography step using the above-described exposure conditions and the pattern group for modeling is obtained.

Next, convolving integration of the image intensity distribution I(x) with a multi-Gaussian function MG(x) of the following equation (1) is carried out.

Next, a threshold value is calculated with respect to a light intensity distribution obtained by the convolving integration, and a predictive model including a non-determined parameter set ($C_i$, $\Delta L_i$) is obtained. The light intensity distribution necessary for forming a resist pattern is obtained by the calculation of the threshold value.

Thereafter, the non-determined parameters ($C_i$, $\Delta L_i$) in the multi-Gaussian function are determined by the fitting using the mask drawing data corresponding to the line & space pattern having the selected combination of the pitch and bias, and the reference mask line width.

$$MG(x) = \sum_i Ci \cdot \frac{1}{\sqrt{\pi} \Delta L_i} \exp\left(-\frac{x^2}{\Delta L_i^2}\right) \quad (1)$$

Figure 9:
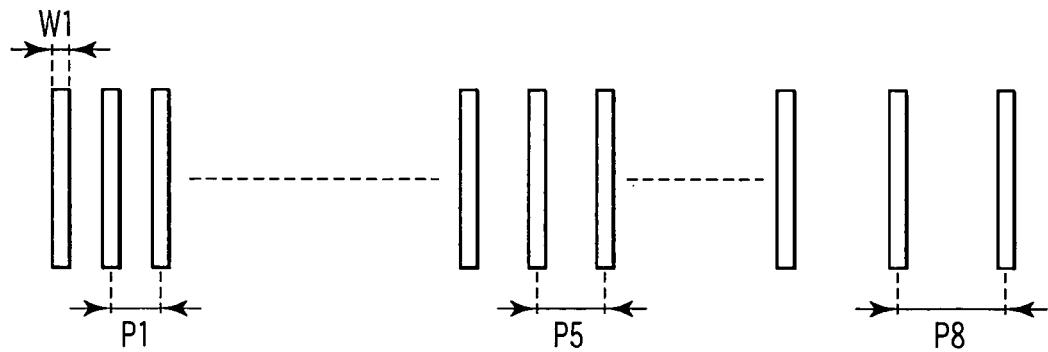
FIG. 9 is a diagram showing a concrete example of a conventional pattern group for modeling.

A prediction precision of the predictive model (embodiment) obtained in this manner was compared with that of a conventional predictive model. A conventional method of creating the predictive model is basically the same as the method of the present embodiment except that the model is prepared using the pattern group for modeling shown in FIG. 9. FIG. 5 shows results of the comparison. A residual of the ordinate indicates a value obtained by subtracting the line width obtained in the predictive model from the line width (0.14 μm) of the line & space pattern on the wafer. According to the present embodiment, it is seen from FIG. 5 that the predictive model having a prediction precision higher than that of a conventional model is obtained.

That is, according to researches of the present inventors, it has been seen that, as shown in FIG. 3, the non-determined parameter in the predictive model is determined using the line & space pattern (pitch, line width) from which a graph having a constant CD value is obtained on a P (abscissa)-CD (ordinate) coordinate to thereby obtain the process proximity effects including a high prediction precision.

Figure 6:
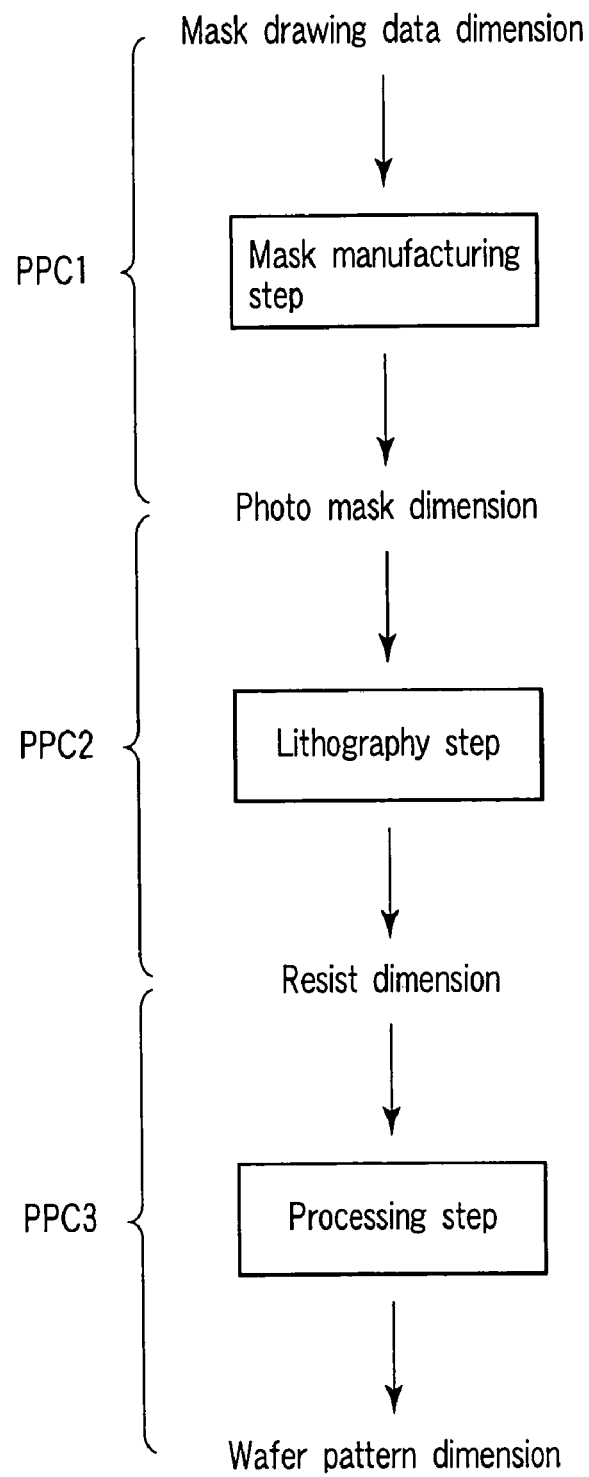
FIG. 6 is a diagram showing a method of creating a predictive model for each of a mask manufacturing step, lithography step, and processing step to perform PPC (PPC1-3) for each step.

It is to be noted that in the present embodiment, the predictive model for directly predicting the finally obtained dimension of the pattern on the wafer from the mask drawing data has been described. However, as shown in FIG. 6, the predictive model can be formed for each of a mask manufacturing step, a lithography step, and a processing step to perform PPC (PPC1-3) for each step.

An output (photo mask dimension) of the predictive model for use in PPC1 becomes an input of the predictive model for use in PPC2, and an output (resist dimension) of the predictive model for use in PPC2 becomes an input of the predictive model for use in PPC3. The output of the predictive model for use in PPC3 is a dimension (wafer pattern dimension) of the pattern formed on the wafer, and the input of the predictive model for use in PPC1 is a dimension on the mask drawing data. That is, the process proximity effects for each step are modeled in such a manner as to input a dimension which defines an object of the previous step and to output a dimension which defines the object of the present step. The previous step of PPC1 is a step of forming the mask drawing data.

Moreover, in the present embodiment, the line & space patterns having different line widths and pitches have been used as the pattern group for modeling, but contact hole patterns having different opening dimensions and pitches can be used.

When an opening shape of a contact hole is rectangular, opening dimensions correspond to dimensions of long and short sides of a rectangle. When the opening shape of the contact hole is square, the opening dimension is a dimension of one side of a square. When the opening shape of the contact hole is circular, its radius or a diameter could be represented as the opening dimension.

In the line & space pattern, each of the input and the output of the predictive model is defined by one dimension. However, in the contact hole pattern having a rectangular opening shape, each of the input and the output of the predictive model is a shape defined by two dimensions.

The CD value (predetermined dimension or shape) is preferably a value of a pattern obtained through the respective steps and having a minimum dimension of a semiconductor device or a pattern having a largest fluctuation in each step. The former is minimum dimension defined upon a design constraint (Design Rule) which is used for designing a semiconductor device, examples of the former are minimum gate width or minimum wiring width, etc. Examples of the latter value include a width W of a portion a wiring 12 connected to the extraction electrode 11 in the vicinity of an extraction electrode 11 as shown in FIG. 7. The extraction electrode 11 and the wiring 12 are disposed in a memory cell. A plurality of CD values may exist. For instance, it is considered that a gate line group which is mostly frequently used under the design can be selected.

Second Embodiment

FIGS. 8A to 8C are explanatory views showing a method of managing a semiconductor manufacturing step according to the second embodiment of the present invention.

In FIGS. 8A to 8C, the ordinate shows a dimension difference (ΔCD) between the present step and the previous step. Concretely, the ordinate of FIG. 8A shows CD of a photo mask (present step)-CD of the mask drawing data (one step before), the ordinate of FIG. 8B shows CD of a resist (present step)-CD of the photo mask (one step before), and the ordinate of FIG. 8C shows CD of a wafer pattern (present step)-CD of the resist (one step before). The abscissa shows a pattern environment (e.g., the pitch of the line & space pattern of the first embodiment) P.

One-dot chain lines in FIGS. 8A to 8C shows the pattern environment P in which a predetermined dimension is obtained after a processing step and a target value of ΔCD corresponding to the environment. Instead of the target value of ΔCD, a dimension difference between the present step and the previous step, acquired at a time when conditions of a process are determined, may be shown. A width ΔDi(i=1-3) defined by two solid lines in FIGS. 8A to 8C shows a process control width (allowable range) in each step.

Figure 20:
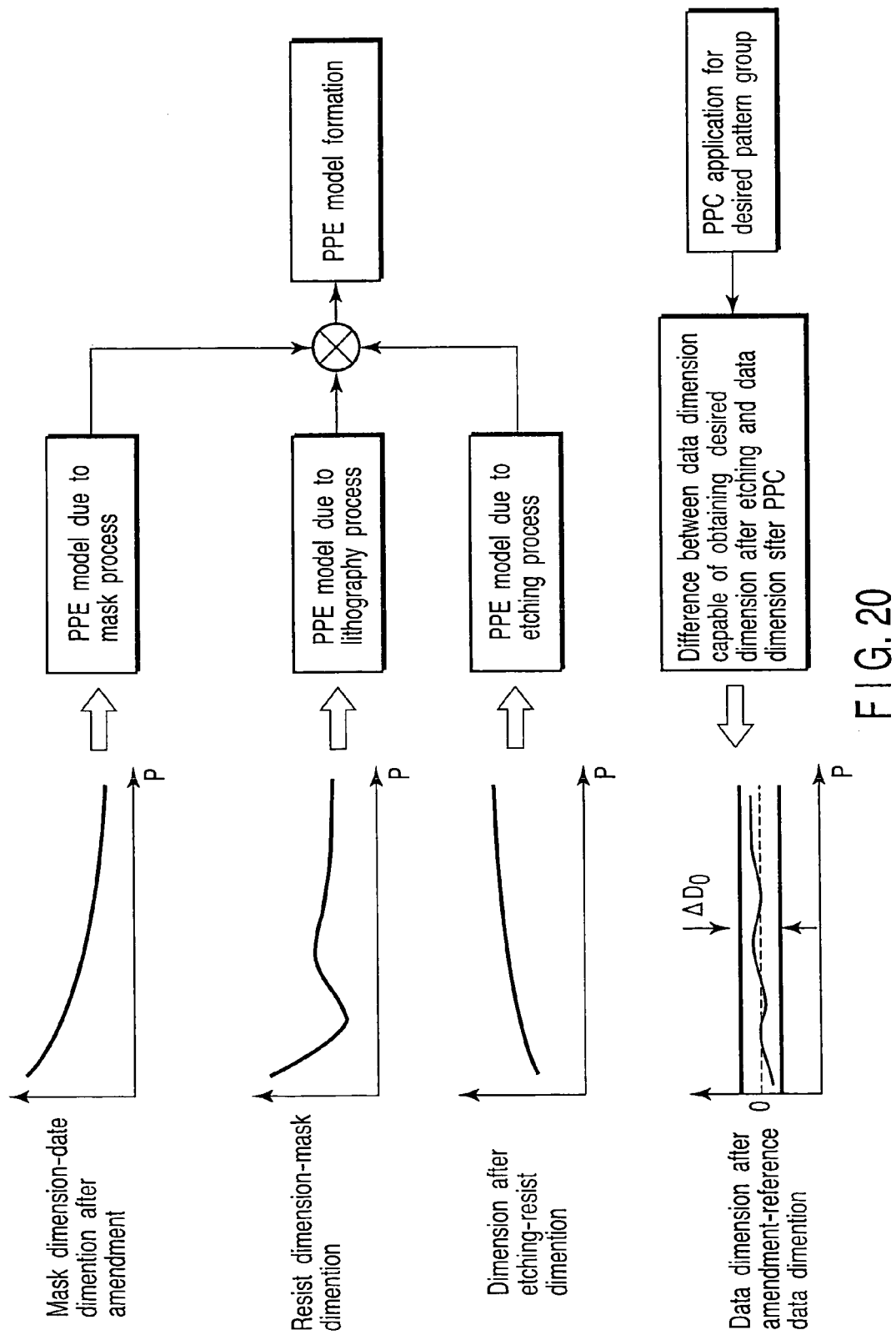
FIG. 20 is diagram showing difference between data dimension after PPC of the second embodiment and reference dimension obtained by the first embodiment.

The difference between date dimension after PPC and date dimension (reference dimension) to be the desired pattern after processing obtained in the first embodiment is shown in FIG. 20. The date dimension after PPC is obtained by forming process proximity effect model (PPE model) for each of between steps based on the dimension difference data of each step as in the FIG. 8, forming a PPE model by synthesizing those PPE models, and applying the synthesized PPE for desired pattern. The ΔCD0 as the PPC treatment control width (control range) can be also set for the difference as in the process control width.

A portion corresponding to a combination of a predetermined pattern environment and bias is periodically checked whether falls within the process control width (ΔDi) or not in process steps (photo mask manufacturing step, lithography step, processing step) corresponding to FIGS. 8A to 8C. In the PPC treatment, control and inspection are carried out so that the portion corresponding to the combination of the predetermined pattern environment and bias fall within the PPC treatment control width (ΔD0).

The portion corresponding to the combination of the predetermined pattern environment and the bias is, for example, a combination ((P1, W1), ..., (P5, W2), ..., (P8, W3)) of the pitch and the bias, obtained in the step S4 of the first embodiment.

In a case where a step in which the checked portion does not fall within ΔDi is detected, the step is adjusted in such a manner that PPE falls within the above-described range with respect to the step. Alternatively, when the width does not fall within the range by the adjustment of the step, the mask formed by changing a PPC setting corresponding to the present step is applied. Accordingly, it is possible to control dimension fluctuations by fluctuations of process proximity effects.

Thereinafter a specific setting method for $\Delta Di$ (i=0-3) is explained based on same examples.

An allowable shift amount from a desired wafer pattern dimension, generated by the fluctuation of the process proximity effect, is defined as $\Delta Dtotal$. $\Delta Dtotal$ can be set as one of factor for an allowable CD error set on a device operation. The allowable CD error in a general LSI circuit design is mostly set as ±15% of desired CD. The allowable CD error is the value that includes the process proximity effect and other error factors (for instance, exposure dose fluctuation, focus fluctuation, etc). Therefore, the allowable CD error multiple by a modulus less than 1 is applicable as the method for setting the $\Delta Dtotal$.

Figure 21A:
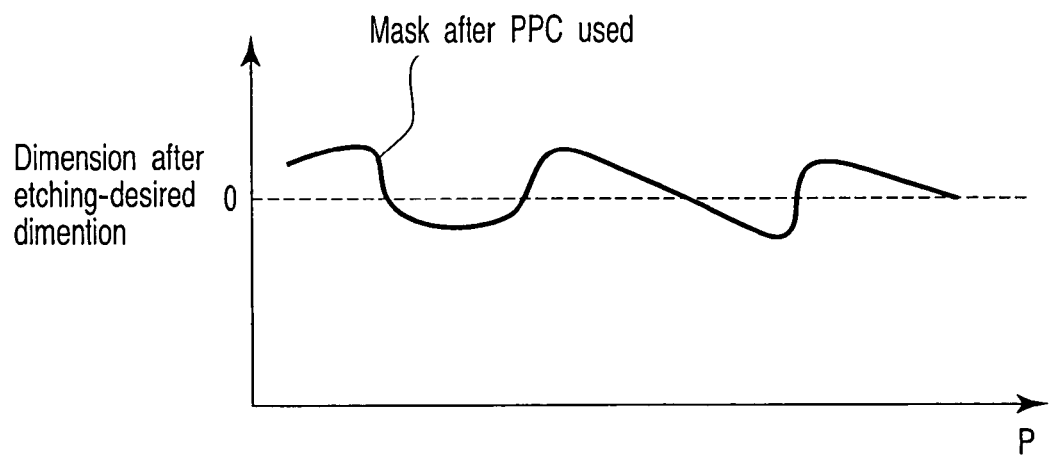
FIGS. 21A and 21B are diagrams showing another evaluation method of ΔDtotal.
Figure 21B:
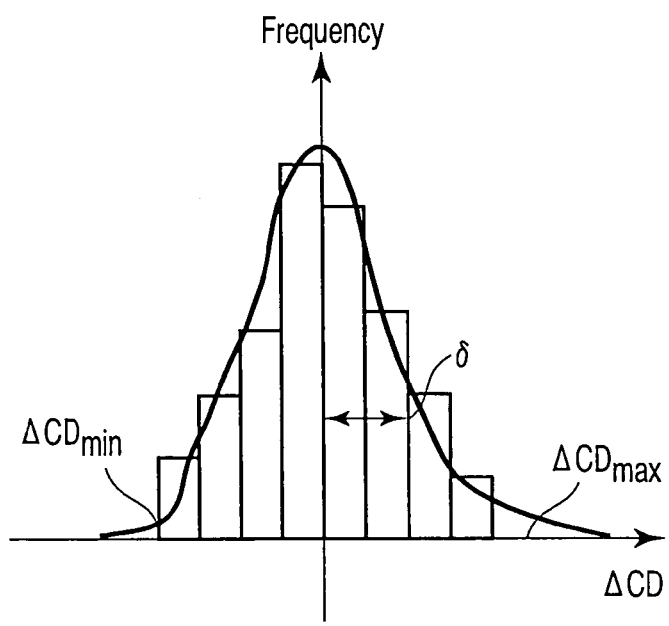

As a method for evaluating the $\Delta Dtotal$, there is a method that sets the $\Delta Dtotal$ for a precedently determined pattern environment group based on a frequency distribution of difference amount between dimension after etching and desired dimension shown as in FIGS. 21A and 21B (here in case that the pattern pitch is modified with fixing the desired dimension is illustrated). For example, it can be defined by a $\Delta CDmax - \Delta CDmin$ of the distribution. Further it can be defined based on a standard variation obtained by carrying out statistics analysis for the distribution. As a mean value for the difference amount, the following definition can be used.

$$\Delta CDave = (1/N) * \Sigma |\Delta CDi|.$$

Each of the Di for the $\Delta CDtolal$ can be determine as follows.

$$\Delta Dtotal = \Delta CDdate + \Delta CDmask + \Delta CDresist + \Delta CDetch \quad (2\text{-}1)$$

or $$\Delta Dtotal = \sqrt{(\Delta CDdate^2 + \Delta CDmask^2 + CDresist^2 + \Delta CDetch^2)} \quad (2\text{-}2)$$

$$\Delta CDdata = \Delta CDmask = \Delta CDresist = \Delta CDetch$$

$\Delta CDdata$: allowable amount of the fluctuation of a mask drawing data value caused by data processing;

$\Delta CDmask$: allowable amount of the fluctuation of a photo mask dimension caused by mask manufacturing (on-wafer dimension conversion value);

$\Delta CDresist$: allowable amount of the fluctuation of a resist dimension caused by exposure and development of resist; and $\Delta CDetch$: allowable amount of the fluctuation of a wafer pattern dimension caused by processing (including etching process).

The examples of the fluctuation caused by the data processing include a fluctuation by OPC.

The examples of the fluctuation caused by the mask manufacturing include fluctuations of stability of a dose of a mask drawing apparatus, stability of precision of a shot position, stability of etching of a mask processing device and the like.

The examples of the fluctuation caused by the exposure include fluctuations of stability of illumination of an exposure equipment, focus stability, stabilities of pre-baking, post-baking temperature, time, and uniformity in a resist coating developing device, and stabilities of temperature at the time of developing, developing time, and a rinsing step.

The examples of the fluctuation caused by the processing include fluctuations of a micro loading effect attributed to the fluctuation of a coating ratio, a processing time, and a flow rate and composition ratio of an etching gas at the time of the processing.

In addition to the relationships, by determining relationship for each of between the $\Delta Dis$, the $\Delta Di$ can be determined uniquely. For example, in case that $\Delta Di$ is constant regardless of i, the $\Delta Di$ is determined as follows.

$\Delta Di = \Delta Dtotal/4$ by the equation (2-1)

$\Delta Di = \Delta Dtotal/2$ by the equation (2-2)

Next, a method of determining $\Delta Di$ based on a dimension fluctuation sensitivity (increase coefficient) between the present step and the previous step.

First, with respect to a repetition pattern which comprises repetition basic patterns, a pattern group which comprises a plurality of repetition patterns is prepared by changing a first dimension which defines the basic pattern and a second dimension which defines the repetition.

Next, one repetition pattern is selected from the pattern group. Here, for simplicity, a case where one repetition pattern is selected will be described. However, when a plurality of repetition patterns are selected, the following method is applied to each repetition pattern.

Next, design data corresponding to the selected repetition pattern is subjected to the data processing (step of forming mask drawing data), and the mask drawing data is prepared.

A data difference (actual value–target value) from a target data value (target value of a control value of the step of forming the mask drawing data) of an actual data value (actual value of the control value of the step of forming the mask drawing data) of the mask drawing data formed in the step of forming the mask drawing data is defined as $\delta CDdata$.

Next, the photo mask is manufactured by the step of manufacturing the photo mask using the mask drawing data including the data value difference.

A dimension difference (actual dimension value–target dimension value) from a target dimension value (target value of the control value of the step of manufacturing the photo mask) of an actual dimension value (actual value of the control value of the step of manufacturing the photo mask) of the photo mask manufactured by the step of manufacturing the photo mask is defined as $\delta CDmask$.

$$R0 = \delta CDmask/\delta CDdata \quad (3)$$

The above is defined as a dimension fluctuation sensitivity (first ratio) of the photo mask, generated in the step of manufacturing the photo mask and attributed to the step of forming the mask drawing data.

The above equation means that the fluctuation of the value of the mask drawing data attributed to the data processing is amplified by R0 times on the photo mask, and the fluctuation is generated in the dimension of the photo mask.

Similarly, to define the dimension fluctuation sensitivity attributed to the mask manufacturing and the exposure, assuming:

$\delta CDresist$: dimension difference from the target dimension value (actual value of the control value of the lithography step) of the actual dimension value (actual value of the control value of the lithography step) of a photo resist formed by the lithography step (resist pattern); and $\delta CDetch$: dimension difference from the target dimension value (actual value of the control value of the processing step) of the actual dimension value (actual value of the control value of the processing step) of the pattern on the wafer formed by the processing step (wafer pattern), a dimension fluctuation sensitivity R1 (second ratio) attributed to the step of manufacturing the photo mask in the lithography step is given by the following equation:

$$R1 = \delta CDresist/\delta CDmask \quad (4), \text{and}$$

a dimension fluctuation sensitivity R2 (third ratio) attributed to the lithography step in the processing step is given by the following equation:

$$R2 = \delta CDetch/\delta CDresist \quad (5).$$

It is to be noted that the dimension fluctuation sensitivity R1 is equal to a coefficient known as a mask CD error enhancement factor (MEF).

The control value of the step can be determined as follows in consideration of the dimension fluctuation sensitivity and the propagation of the dimension defined heretofore.

The difference $\delta CDdata$ from the target value of the actual value of the mask drawing data attributed to the data processing influences the dimension of the photo mask with the dimension fluctuation sensitivity R0, influences the resist dimension after the lithography step with the dimension fluctuation sensitivity R1, and influences the wafer pattern dimension after the processing step with the dimension fluctuation sensitivity R2.

That is, the difference from the target value of the actual value of the mask drawing data attributed to the data processing fluctuates the wafer pattern dimension after the processing step by $R0 \cdot R1 \cdot R2 \cdot \delta CDdata$.

When the difference $\delta CDmask$ from the target dimension value of the actual dimension value of the photo mask attributed to the mask manufacturing, the dimension difference $\delta CDresist$ from the target dimension value of the actual dimension value of the resist pattern attributed to the lithography, and the dimension difference $\delta CDetch$ from the target dimension value of the actual dimension value of the wafer pattern attributed to the processing are similarly considered, a difference $\delta CDtotal$ from the target dimension value of the actual dimension value of the wafer pattern after the final processing step is represented as follows.

$$\delta CDtotal = R0 \cdot R1 \cdot R2 \cdot \delta CDdata + R1 \cdot R2 \cdot \delta CDmask + R2 \cdot \delta CDresist + \delta CDetch \quad (6)$$

The actual control width $\Delta CDi$ can be obtained by the equation (6) of the propagation of the dimension difference. Assuming that an allowable range of the difference from the target dimension value of the actual dimension value of the wafer pattern obtained through the step of preparing the mask drawing data, the step of manufacturing the photo mask, the lithography step, and the processing step is a control width $\Delta CDtotal$ (control value); an allowable range (first allowable range) of $\delta CDmask$ of the step of preparing the mask drawing data is a control width $\delta CDdata$ (control value); an allowable range (second allowable range) of $\delta CDmask$ of the step of manufacturing the photo mask is a control width $\Delta CDmask$ (control value); an allowable range (third allowable range) of $\delta CDresist$ of the lithography step is a control width $\Delta CDresist$ (control value); and an allowable range of $\delta CDetch$ of the processing step is a control width $\Delta CDetch$ (control value), the following results:

$$\Delta CDtotal = R0 \cdot R1 \cdot R2 \cdot \Delta CDdata + R1 \cdot R2 \cdot \Delta CDmask + R2 \cdot \Delta CDresist + \Delta CDetch \quad (7).$$

$\Delta CDtotal$ is a value determined from a request in the device design. For example, in case that the dimension error needs to fall within 15 nm in order to keep a design performance of a transistor including a gate pattern with 100 nm design value on a gate layer, the allowable gate pattern dimension is from 85 nm to 115 nm. In this case, the $\Delta CDtotal$ is $\Delta CDtotal = 15$ nm. Here, an allowable range $\Delta CDtotal$ is defined by the actual dimension unit, but can be defined by percentage. In the example, $\Delta CDtotal = 15\%$.

The control widths ($\Delta CDdata$, $\Delta CDmask$, $\Delta CDresist$, $\Delta CDetch$) of the respective process steps are set in a range which satisfies $\Delta CDtotal$ of the above equation (7). The respective process steps are managed in such a manner as to satisfy the control widths of the respective process steps.

Allocation of the control values among the process steps is set by the following equation:

$$R0 \cdot R1 \cdot R2 \cdot \Delta CDdata = R1 \cdot R2 \cdot \Delta CDmask = R2 \cdot \Delta CDresist = \Delta CDetch.$$

In this case, the control values $\Delta CDdata$, $\Delta CDmask$, $\Delta CDresist$, and $\Delta CDetch$ of the respective process steps are given as follows:

$$\Delta CDdata = \Delta CDtotal/(4 \cdot R0 \cdot R1 \cdot R2);$$

$$\Delta CDmask = \Delta CDtotal/(4 \cdot R1 \cdot R2);$$

$$\Delta CDresist = \Delta CDtotal/(4 \cdot R2); \text{ and}$$

$$\Delta CDetch = \Delta CDtotal/4.$$

Here, allowable $\Delta CD$ of each step is set to a certain value regardless of the pattern environment, but does not have to be necessarily the certain value, and the values can differ from each other in at least two or more steps.

FIGS. 11A to 11D are explanatory views showing a managing method in a case where the allowable $\Delta CD$ differs with the pattern environment.

Figure 11A:
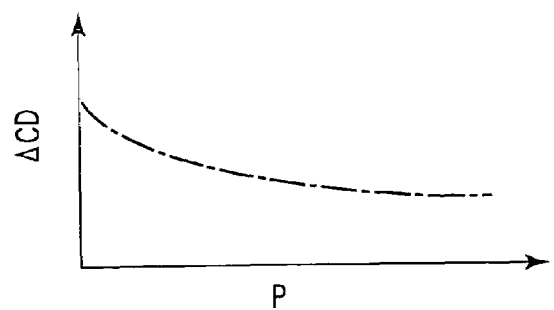
FIGS. 11A to 11D are explanatory views showing a managing method in a case where an allowable ΔCD differs with a pattern environment.
Figure 11B:
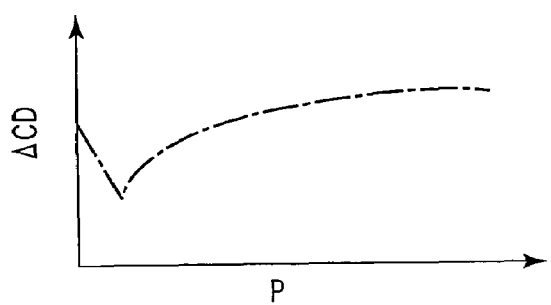

In FIGS. 11A and 11B, the ordinate indicates a CD dimension difference ($\Delta CD$) between the present step and the previous step, and the abscissa indicates the pattern environment (P). The ordinate of FIG. 11A indicates CD of the photo mask (present step)—CD of the mask drawing data (one step before), and the ordinate of FIG. 11B indicates CD of the resist (present step)—CD of the photo mask (one step before).

Figure 11C:
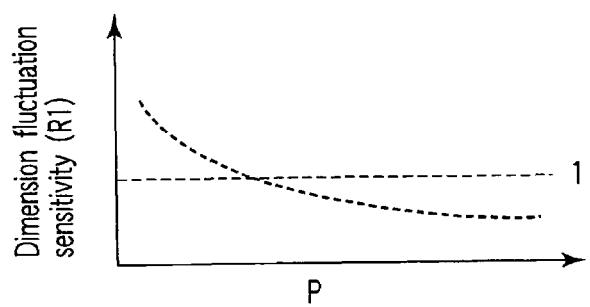
Figure 11D:
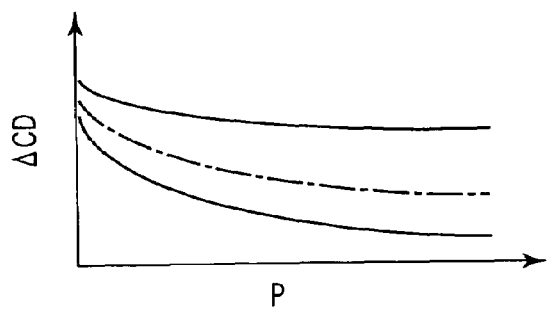

FIG. 11C shows a state in which the dimension fluctuation sensitivity (R1) of the mask dimension with respect to the resist dimension on the ordinate has a different value by the pattern environment (P) on the abscissa. In this case, to set the influence of the dimension fluctuation attributed to the mask manufacturing on the resist dimension to a certain value, dimension management of the mask needs to be changed in accordance with the pattern environment as follows. In FIG. 11C, the dimension fluctuation sensitivity on a dense pitch side (left side of the abscissa) is large as compared with an isolated line (right side of the abscissa). Therefore, in the management of the mask dimension, the mask dimension is more strictly managed on the dense pitch side as shown by a solid line of FIG. 11D.

It is to be noted that in the above description, the allowable range of each step is equally distributed, but weighted distribution can be performed. That is, assuming that W1 to W4 are first to fourth weight coefficients (not W1=W2=W3=W4), the respective allowable values ($\Delta CDdata$, $\Delta CDmask$, $\Delta CDlitho$, $\Delta CDetch$) can be set in a range which satisfies $\Delta CDtotal = W1 \cdot R0 \cdot R1 \cdot R2 \cdot \Delta CDdate + W1 \cdot R1 \cdot R2 \cdot \Delta CDmask + W3 \cdot R2 \cdot \Delta CDlitho + W4 \cdot \Delta CDetch$. The equation (7) represents a case where W1=W2=W3=W4=1.

Moreover, here, as described above, the case where one repetition pattern is selected has been described. However, when a plurality of repetition patterns are selected, $\Delta CDtotal$ is set for each pattern. In this case, one $\Delta CDtotal$ common to all the patterns can also be set, or different $\Delta CDtotal$ can be set with respect to two or more patterns. In general, when different $\Delta CDtotal$ (optimum $\Delta CDtotal$) is set for each pattern, management precision rises.

Figure 12:
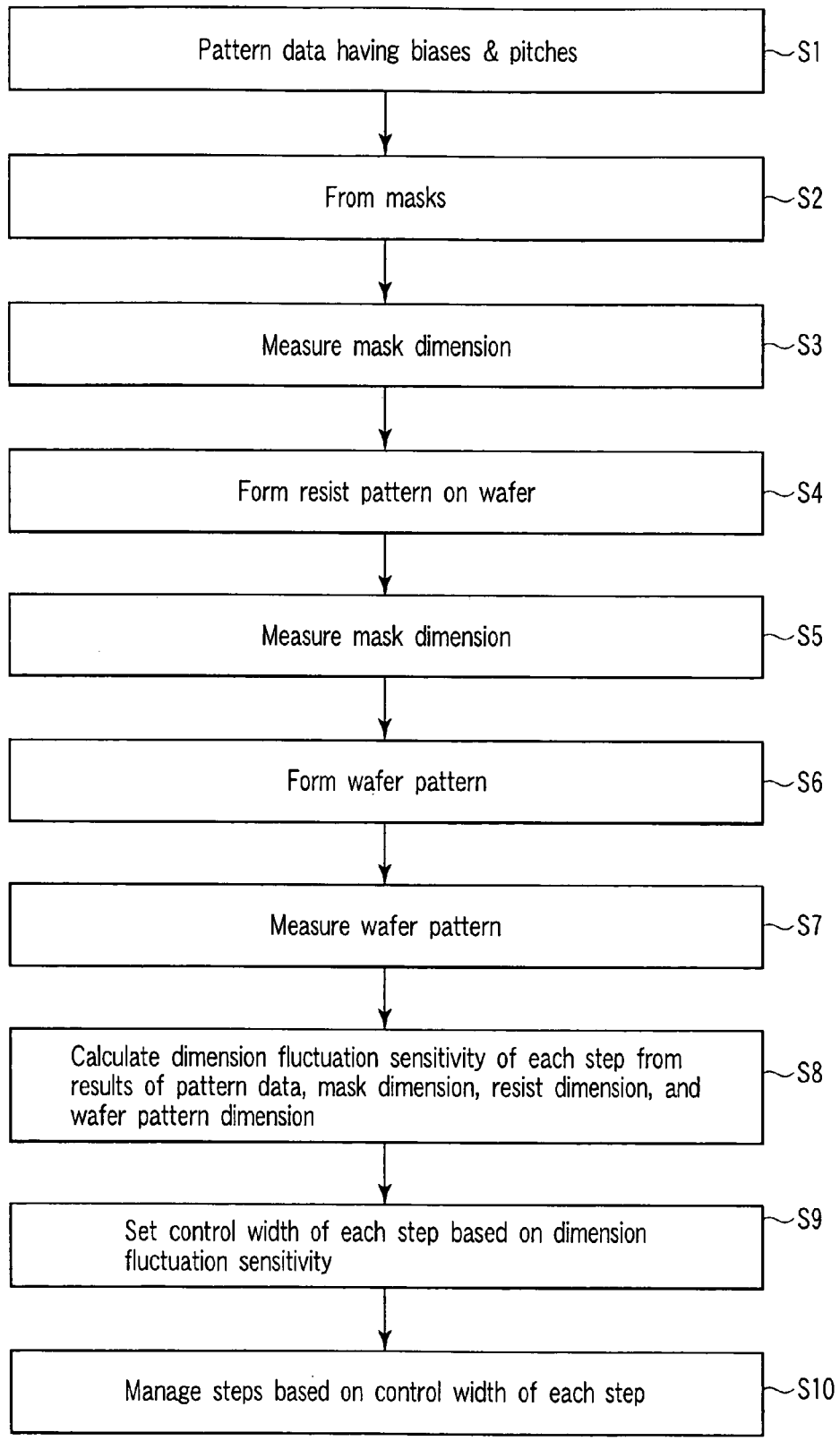
FIG. 12 is a flowchart showing a method of managing the step of manufacturing the semiconductor according to the second embodiment of the present invention.

FIG. 12 is a flowchart showing a method of managing the step of manufacturing the semiconductor according to the second embodiment of the present invention.

First, mask drawing data (mask pattern data) is prepared corresponding to a pattern group which comprises a plurality of line & space patterns obtained by changing line widths (biases) of line patterns and pitches of the line & space patterns with respect to the line & space patterns which comprises repetition line patterns (step S1).

Here, the line & space pattern group shown in FIG. 2 are used as the pattern group. There are three types of line widths (biases) W1 to W3. There are eight types of pitches P1 to P8. Therefore, the mask drawing data (mask pattern data) corresponding to 24 types of the line & space patterns is prepared.

Next, 24 types of patterns corresponding to the pattern group are formed on a wafer (step S2). Mask dimensions ((P1, W1mask), . . . , (P5, W2mask), . . . , (P8, W3mask)) corresponding to the respective patterns are measured (step S3).

Next, a lithography step including an exposing process, a developing process and the like using the photo masks prepared in the step S2 is performed to form a resist pattern (step S4).

Also in the resist pattern, dimensions ((P1, W1resist), . . . , (P5, W2resist), . . . , (P8, W3resist)) of the pattern group corresponding to the 24 types are measured (step S5).

Thereafter, a processing step including a process of etching a substrate film (e.g., a polysilicon film) formed on the wafer precedently using the resist pattern is performed to form line & space patterns on the wafer (step S6).

In the same manner as in the photo mask and the resist pattern, dimensions ((P1, W1etch), . . . , (P5, W2etch), . . . , (P8, W3etch)) of the processed wafer patterns corresponding to the 24 patterns are measured (step S7).

When the step S7 is finished, data values, photo mask dimensions, resist dimensions, and wafer pattern dimensions corresponding to 24 types of patterns are obtained. The dimension fluctuation sensitivities of the respective steps are obtained from these dimension measurement results.

A method of calculating the fluctuation sensitivities of the photo mask dimensions with respect to the resist dimensions will be concretely described with reference to FIG. 13.

Figure 13:
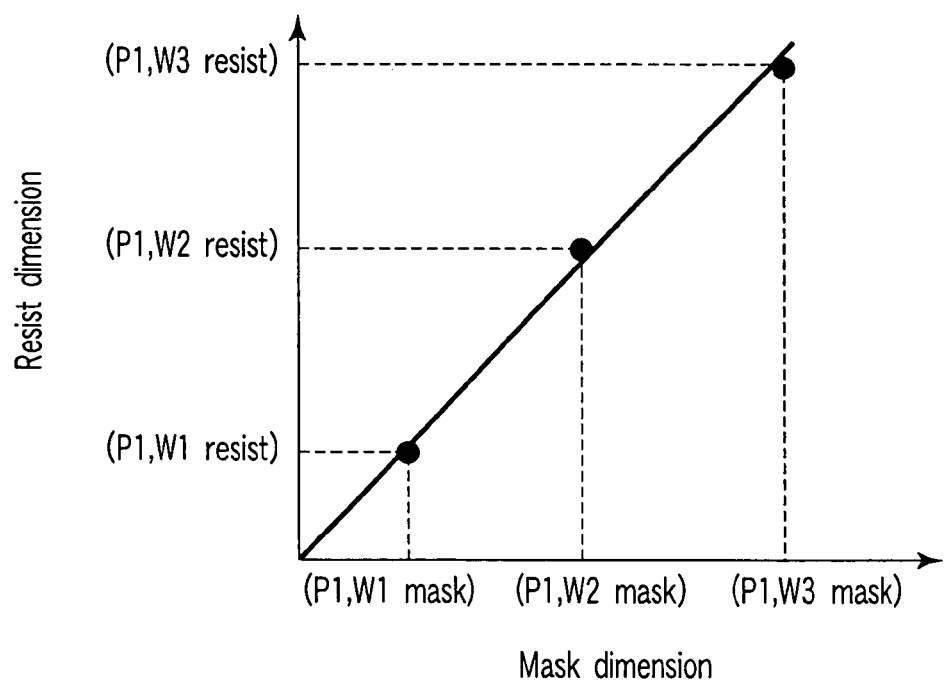
FIG. 13 is an explanatory view showing a method of calculating a fluctuation sensitivity of a photo mask dimension with respect to a resist dimension.
Figure 10:
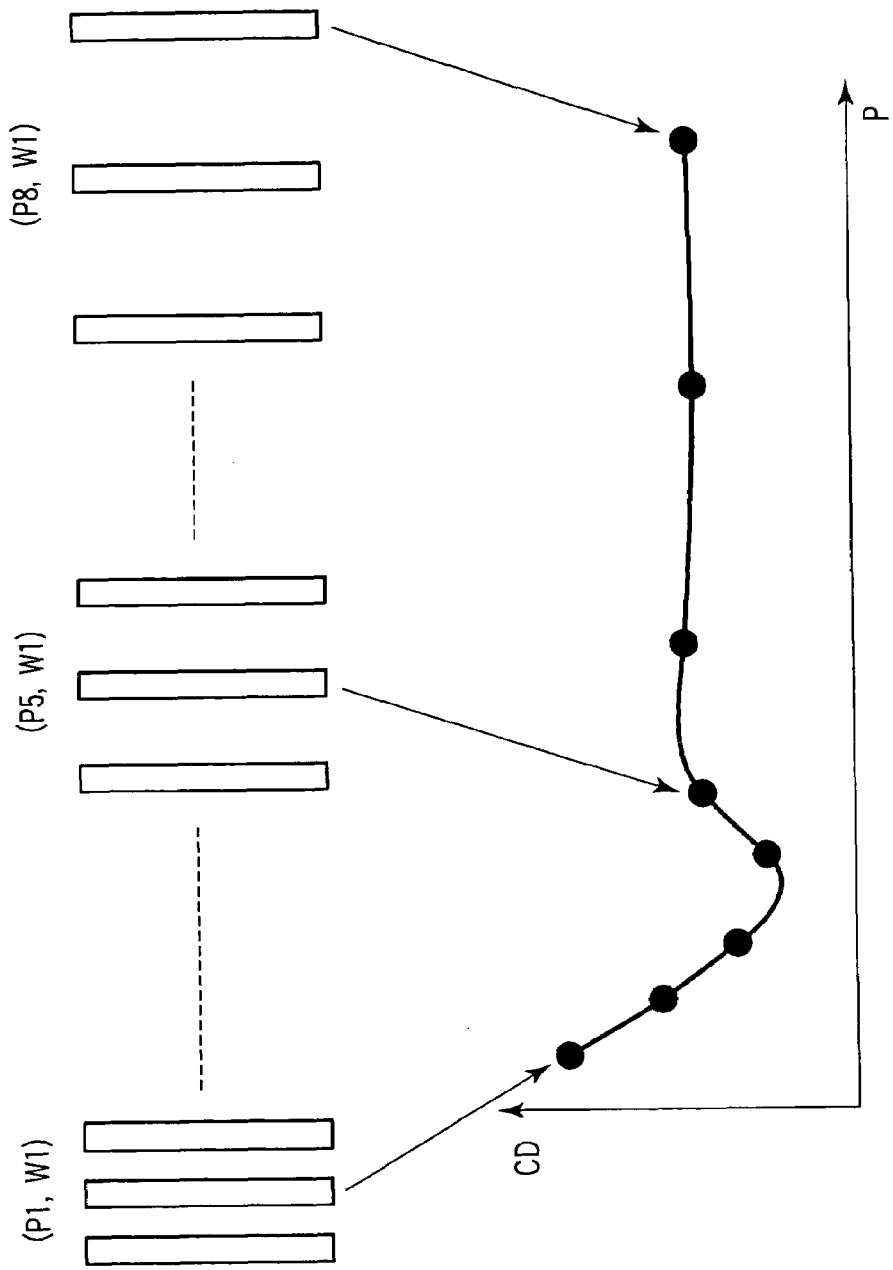
FIG. 10 is a diagram showing a relation between pitches obtained in a conventional predictive model and CDs of finished line & space patterns on wafers.

In FIG. 13, the abscissa indicates the mask dimensions ((P1, W1mask), (P1, W2mask), (P1, W3mask)) corresponding to the patterns (P1, W1), (P1, W2), (P1, W3) of the drawing data, and the ordinate indicates the resist dimensions ((P1, W1resist), (P1, W2resist), (P1, W2resist)) corresponding to the patterns of the drawing data.

When correlation data between the mask dimension and the resist dimension shown by black dots is subjected to, for example, regression analysis, an approximate line shown by a solid line can be obtained. A tilt of the approximate line is a dimension fluctuation sensitivity in a pattern environment P1. Similar analysis is also performed with respect to patterns whose pattern environments are P2 to P8.

Moreover, the dimension fluctuation sensitivity of the drawing data with respect to the mask dimension, and the dimension fluctuation sensitivity of the resist pattern with respect to the wafer pattern dimension after the processing step are also calculated (step S8).

Next, the control widths of the respective steps are determined based on the calculated dimension fluctuation sensitivities (step S9). A method of determining the control width can be set to one of the above-described methods of the present embodiment.

Moreover, each step is managed based on the calculated control width (step S10). For example, the respective steps are managed in such a manner that the difference from the target value of the actual value of each step falls within the calculated control width.

As described above, the dimensions of the photo mask and the wafer are actually measured, and the dimension fluctuation sensitivity of each step is obtained based on the measurement results. However, when some of the dimensions can be calculated using simulation, the dimensions can be obtained by the simulation, and the dimension fluctuation sensitivities can be obtained based on simulation result.

Moreover, a step of obtaining the dimension fluctuation sensitivity can be omitted in a step in which the dimension fluctuation does not increase and is apparently constant regardless of pattern environment.

Also in manufacturing the photo mask, in the same manner as in the step of manufacturing the semiconductor, the photo mask is completed through the lithography step (a pattern drawing step using an electron beam or a laser beam, a developing step of the resist), and the processing step (e.g., an etching step of a chromium shielding film). Therefore, it is also possible to apply the method of managing the steps of the present embodiment to the manufacturing of the photo mask.

Moreover, instead of all the steps, some of the step of forming the mask drawing data, the step of manufacturing the photo mask, the lithography step, and the processing step can be managed in accordance with the above-described management method of the embodiment.

Third Embodiment

The third embodiment of the present invention will be described hereinafter. As described in the present specification, as the method of setting the control width with respect to the target dimension for each of the steps (the step of forming the mask drawing data, the step of manufacturing the photo mask, the lithography step, the processing step) of the manufacturing process of a semiconductor device), the following methods (1) and (2) have been described:

(1) the method of equally dividing the control width with respect to the average value or the standard deviation value of the residual from the target line width in all the patterns; and (2) the method of converting the dimension fluctuation attributed to each step into the final finally obtained dimension fluctuation in consideration of the dimension fluctuation sensitivity between the steps to set the control width of each step.

In the present embodiment, a method of managing the steps in consideration of a systematic dimension fluctuation between environments (pattern species) such as pattern pitches will be described.

Figure 14A:
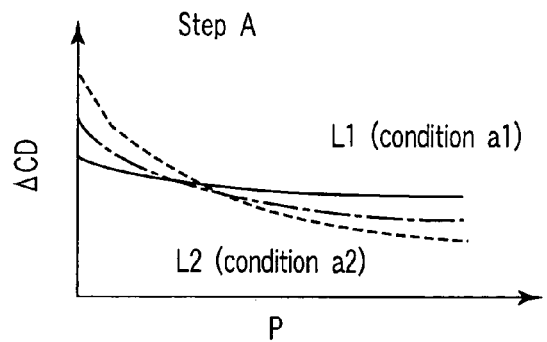
FIGS. 14A and 14B are diagrams showing relations among ΔCD, pattern environment P, and target value of PPE in a step A (conditions a1, a2) and a step B (conditions b1, b2)

FIG. 14A is a diagram showing a relation among ΔCD (dimension difference of CD between the present step and the previous step), pattern environment P, and target value of PPE in a case where a certain step (step A) is performed on two different conditions (conditions a1, a2). Here, the pattern environment P is a pattern pitch. In FIG. 14A, a solid line L1 indicates a ΔCD-P curve in a case where the step A is performed on the condition a1, a broken line L2 indicates a ΔCD-P curve in a case where the step A is performed on the condition a2, and the solid line indicates the target value of the PPE.

Figure 14B:
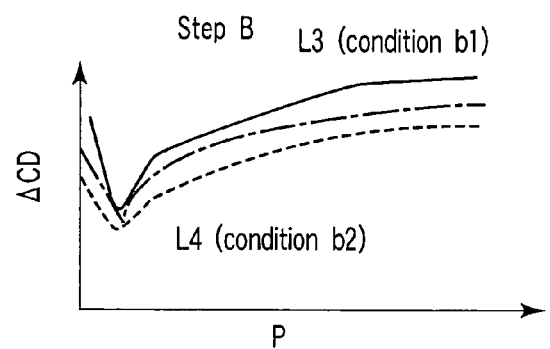

FIG. 14B is a diagram showing a relation among ΔCD, pattern environment P, and target value of PPE in a case where a step (step B) separate from the step A is performed on two different conditions (conditions b1, b2). The pattern environment P is a pattern pitch in the same manner as in FIG. 14A. A solid line L3 indicates a ΔCD-P curve in a case where the step B is performed on the condition b1, a broken line L4 indicates a ΔCD-P curve in a case where the step B is performed on the condition b2, and the solid line indicates the target value of the PPE.

As shown in FIGS. 14A and 14B, in a case where the conditions (process conditions) of the respective steps are adjusted to bring ΔCD close to the target value (ΔCDtarget), the residual amount (ΔCD−ΔCDtarget) generally has a systematic component in accordance with the pattern pitch (pattern environment) in many cases. That is, the residual amount (ΔCD−ΔCDtarget) does not change at random in accordance with the pattern pitch.

As described above, the control width is set based on the standard deviation value (σ) from the target value of each step. This is because specifications concerning final line width control are handled as 3σ=15%×minimum line width using the standard deviation in many cases. Since PPE management plays a role in the management of the line width, it is possible to easily match a PPE control width to the final line width management by use of the management method based on the σ value.

Figure 15A:
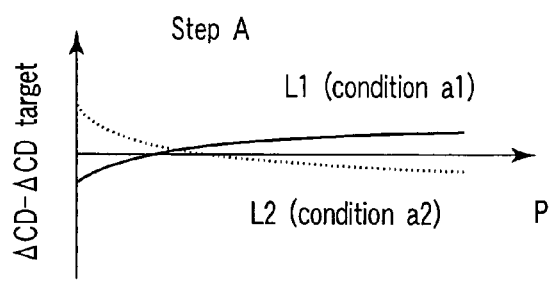
FIGS. 15A and 15B are diagrams showing shift amounts between ΔCD-P curves and the target values of the PPE in the step A (conditions a1, a2) and the step B (conditions b1, b2)
Figure 15B:
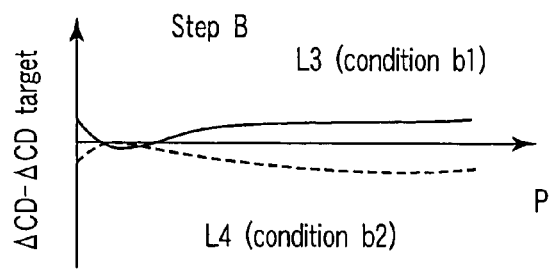

FIG. 15A is a diagram showing a shift amount between curves L1, L2 and the target values of the PPE in a case where the step A is performed on conditions a1, a2, and FIG. 15B is a diagram showing a shift amount between curves L3, L4 and the target values of the PPE in a case where the step B is performed on conditions b1, b2). In the first embodiment, the steps are managed in such a manner that an average value +3σ of the shift amount in a pitch direction is not more than the control width of the PPE matched with the control value of the final line width.

Figure 16A:
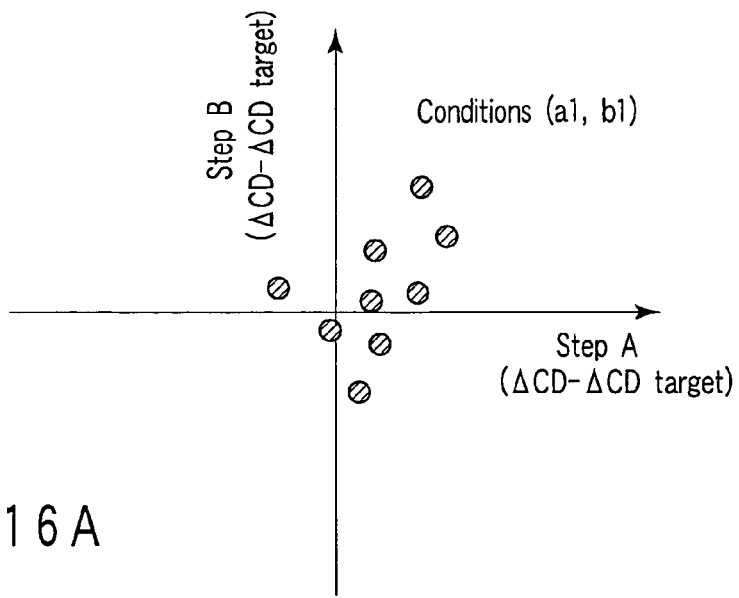
FIGS. 16A and 16B are diagrams showing correlations of PPE fluctuations between the step A (condition a1) and the step B (conditions b1, b2)
Figure 16B:
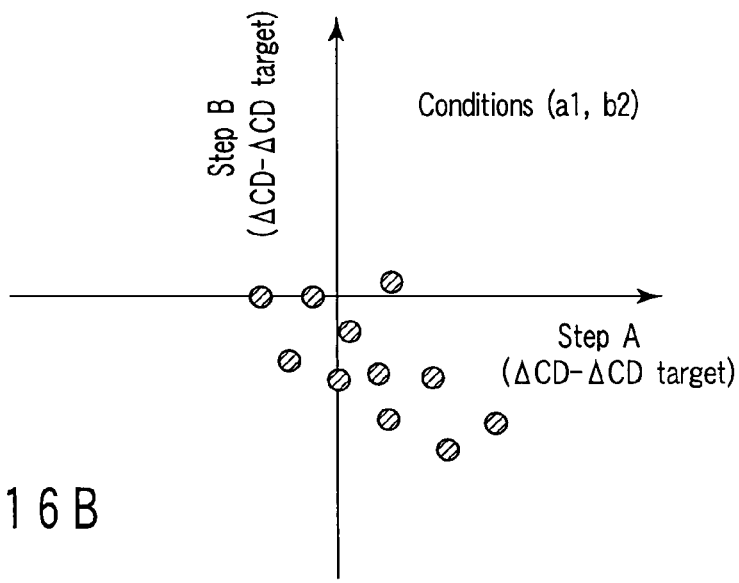

FIGS. 16A and 16B are diagrams showing correlations of PPE fluctuations between the step A (condition a1) and the step B (conditions b1, b2). When systematic error factors of the steps A and B are large as shown in FIGS. 16A and 16B, a correlation coefficient sometimes indicates a value largely deviating from 0.

It is seen that the shift amount from the target value of the actual value of the PPE obtained through the steps A and B cannot be represented by a simple root mean square (RMS) of the PPE control width acquired based on the shift amount from the target value of the actual value of the steps A and B in a case where there is a correlation between the steps A and B as described above.

In the present embodiment, there is proposed a method of managing the process steps, capable of managing the process steps with good precision even with the presence of the above-described large systematic error factor between the steps in performing a dimension control as PPE management based on the σ value.

An actual application example of the present embodiment will be described hereinafter.

Figure 17A:
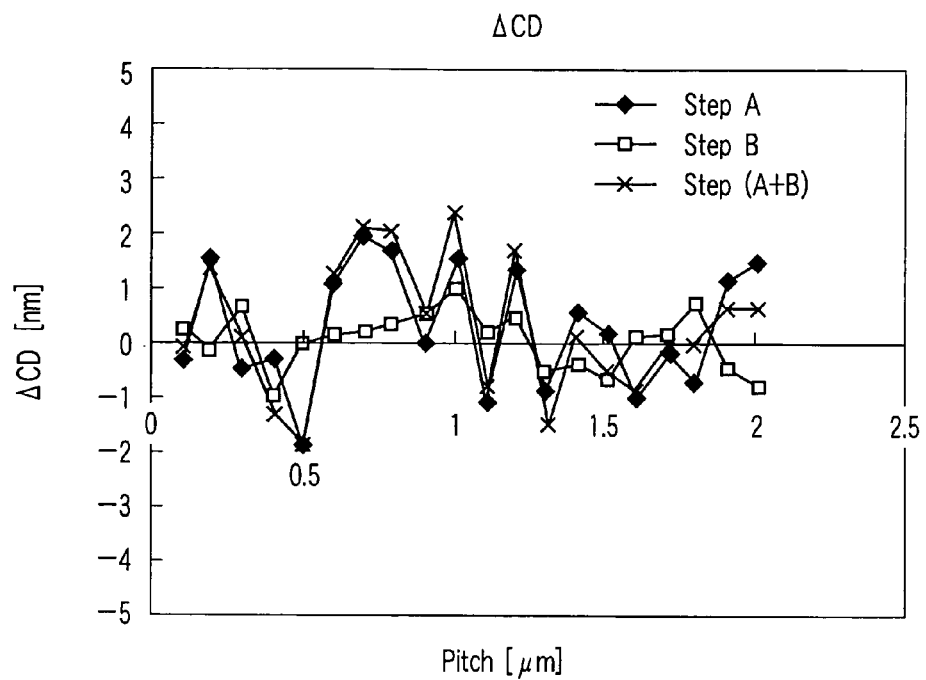
FIGS. 17A and 17B are diagrams showing results of calculation of a residual PPE amount between A and B having small systematic error factors.

FIG. 17A is a diagram showing results obtained by calculation of a residual PPE amount between two steps A and B having small systematic error factors.

Figure 17B:
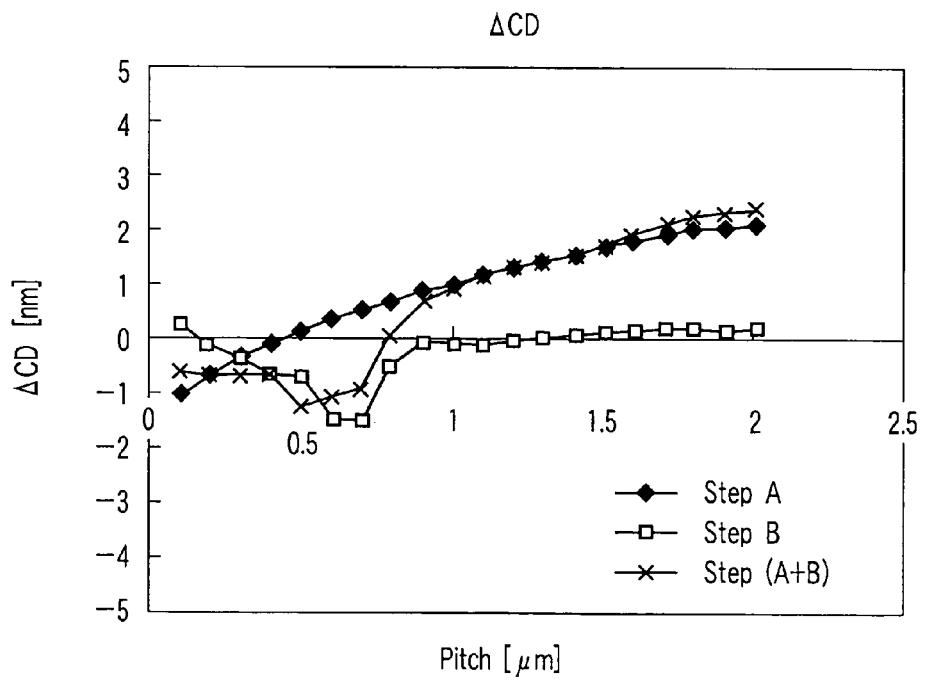

FIG. 17B is a diagram showing results obtained by calculation of a residual PPE amount between two steps A and B having large systematic error factors. The calculation was performed by regarding the sensitivity (dimension fluctuation sensitivity described in the second embodiment) between the steps A and B as 1.

Figure 18A:
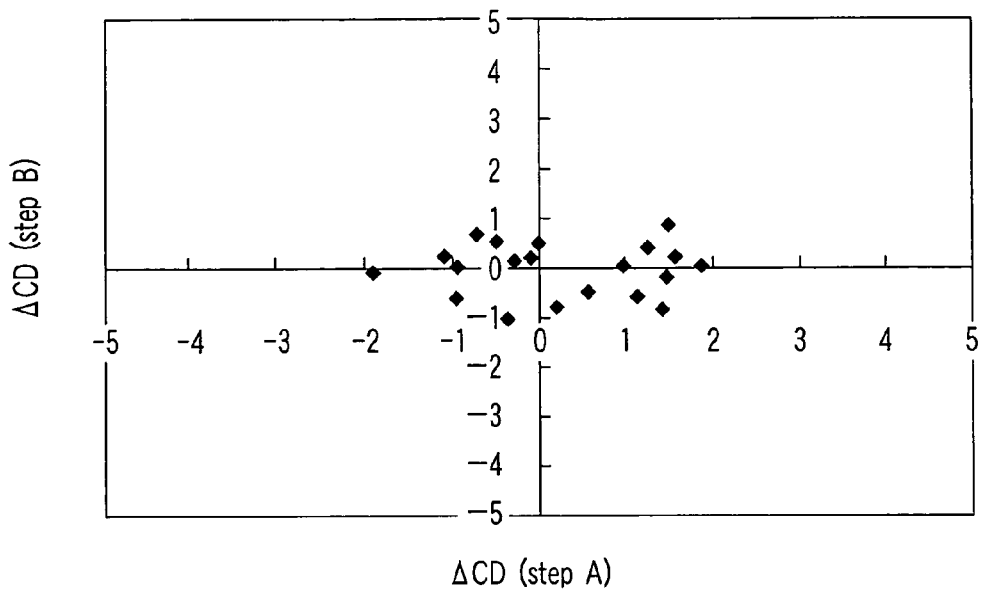
FIGS. 18A and 18B are correlation diagrams between the steps A and B in cases where the systematic error factors are small and large.
Figure 18B:
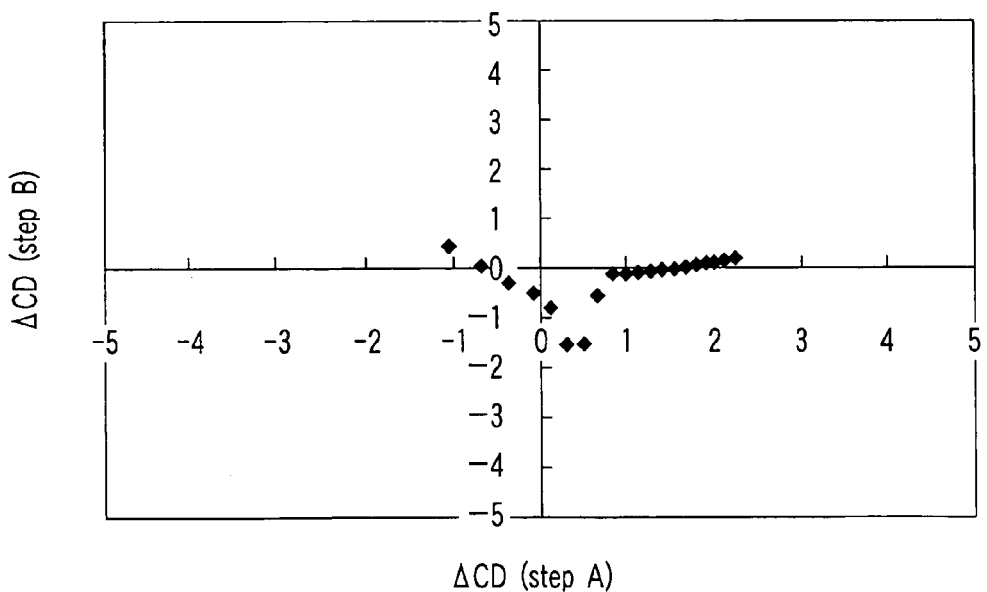

FIGS. 18A and 18B are correlation diagrams between the steps A and B. FIG. 18A is a correlation diagram in a case where the systematic error factor is small, and FIG. 18B is a correlation diagram in a case where the systematic error factor is large. In the diagrams, σA and σB denote standard deviation values of the steps A and B, and σtotal denotes a standard deviation of the residual PPE amount after the steps A and B.

It is seen from FIGS. 18A and 18B that σtotal (=1.24 nm) can be represented by RMS (=1.23 nm) of σA and σB in a case where the systematic error factor is small, but σtotal (=1.25 nm) deviates from RMS (=1.10 nm) of σA and σB in a case where the systematic error factor is large.

It is seen that when the correlation coefficient between the steps A and B in each of FIGS. 18A and 18B is calculated, the coefficient is 0.015 in FIG. 18A, the coefficient is 0.35 in FIG. 18B, and a difference is made between both the coefficients.

Assuming Z=aX+bY, a general propagation equation of dispersion is as follows:

$$\sigma z^2 = a^2 \sigma x^2 + b^2 \sigma y^2 + 2ab\sigma x \sigma y \rho,$$

where ρ is the correlation coefficient.

Since the correlation coefficient is given as a known value, σx, σy can be set in such a manner as to satisfy σz≦σz_spec.

As a concrete example, assuming that allowable errors of the respective steps are equal (σx=σy=σ), and σz≦σz_spec, the equation described above is as follows:

$$\sigma z\_spec^2 = (a^2 + b^2 + 2ab\rho)\sigma^2$$

Therefore, $\sigma = \sigma z\_spec/\sqrt{(a^2+b^2+2ab\rho)}$ can be obtained.

The examples shown in FIGS. 18A and 18B will be described.

When the systematic error factor is small (FIG. 18A), the standard deviation (σtotal') of the residual PPE amount after performing the steps A and B is estimated by the above-described method, and the following results:

$$\begin{aligned}\sigma\text{total}' &= \sqrt{(\sigma A^2 + \sigma B^2 + \sigma A \sigma B \rho AB)} \\ &= \sqrt{(1.11^2 + 0.53^2 + 2*1.11*0.53*0.015)} \\ &= 1.24 \text{ nm.}\end{aligned}$$

When the systematic error factor is large (FIG. 18B), σtotal' is estimated by the above-described method, and it is seen that values sufficiently close to the actual value of σtotal can be obtained with respect to either σtotal' as follows:

$$\begin{aligned}\sigma\text{total}' &= \sqrt{(0.97^2 + 0.52^2 + 2 \times 0.97 \times 0.52 \times 0.35)} \\ &= 1.25 \text{ nm}\end{aligned}$$

Also when three steps exist, the following can be represented:

Z=aX+bY+cW; an $$\sigma z^2 = a^2 \sigma x^2 + b^2 \sigma y^2 + c^2 \sigma w + 2ab\sigma x \sigma y \rho xy + 2bc\sigma y \sigma w \rho yw + 2ca\sigma w \sigma x \rho wx.$$

By calculation assuming that the allowable errors in the respective steps are equal in the same manner as described above, the following can be obtained:

$$\sigma = \sigma z\_spec/\sqrt{(a^2+b^2+c^2+2ab\rho xy+2bc\rho yw+2ca\rho wx)}.$$

A PPE error control width can be set using correlation coefficients among N steps in the same manner as described above.

As described above, when the PPE control width over a plurality of steps is preset, and a relative value of the PPE control width of each step is set, systematic properties of PPE of the respective steps are considered, the PPE control width is distributed using the correlation coefficient between the steps, and accordingly the PPE management can be performed with higher precision.

It is to be noted that the present invention is not limited to the above-described embodiments. For example, the above-described method of managing the steps of the embodiment can be performed as a program for allowing a computer to execute a predetermined procedure. For example, the program of the method of managing the steps of the embodiment of FIG. 12 allows the computer to execute procedures for performing steps S1, S2, S3, S4, S5, S6, S7, S8, S9, S10.

Figure 19:
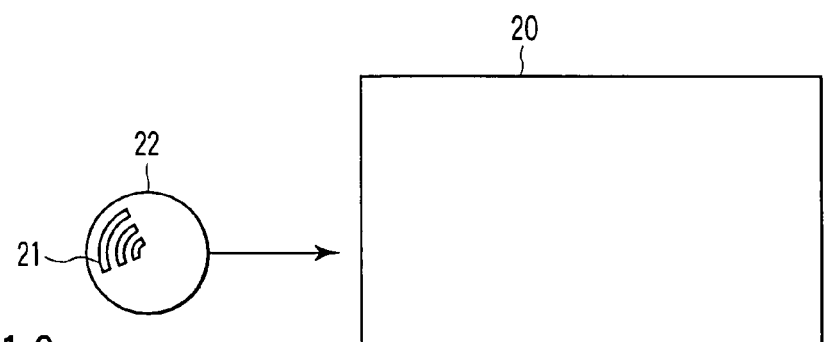
FIG. 19 is an explanatory view of a computer readable recording medium according to another embodiment of the present invention.

Moreover, as shown in FIG. 19, the present invention can be performed as a computer program product (e.g., CD-ROM, DVD) 22 in which a program 21 for allowing a system including a computer 20 to execute the method of managing the steps of the embodiment is recorded.

That is, the computer program product is configured to store program instructions for execution on a computer system enabling the computer system to perform: inputting the step of manufacturing the semiconductor device or the photo mask; and managing the step by the method of managing the step of the embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of creating a predictive model of a process proximity effect comprising: preparing a predictive model of a process proximity effect including a non-determined parameter; and determining the non-determined parameter, the method comprising:
preparing a pattern group for modeling, the pattern group comprising a plurality of repetition patterns, the plurality of repetition patterns being obtained by changing first and second dimensions of a repetition pattern which repeats a basic pattern, the first dimension defining the basic pattern, and the second dimension defining repetition of the basic pattern;
selecting a predetermined repetition pattern from the pattern group for modeling, the basic pattern of the predetermined repetition pattern corresponding to a pattern which is to be formed on a wafer and has a predetermined dimension; and
determining the non-determined parameter in the predictive model based on the predetermined repetition pattern and the pattern having the predetermined dimension.

2. The method of creating the predictive model of the process proximity effect according to claim 1, wherein the basic pattern is a line pattern, the repetition pattern is a line & space pattern, the first dimension is a width of the line pattern, and the second dimension is a pitch of the line & space pattern.

3. The method of creating the predictive model of the process proximity effect according to claim 1,
wherein the predictive model is a model for predicting a pattern which is to be transferred onto the wafer based on a mask drawing data directly.

4. The method of creating the predictive model of the process proximity effect according to claim 3, wherein the repetition pattern repeats a pattern in the mask drawing data.

5. The method of creating the predictive model of the process proximity effect according to claim 1, wherein the predictive model of the process proximity effect including the non-determined parameter is prepared for each of a photo mask manufacturing step, a lithography step, and a processing step, and the non-determined parameters of the predictive models prepared for each of the steps are determined.

6. A method of managing process steps comprising:
selecting predetermined mask drawing data corresponding to a predetermined repetition pattern from mask drawing data, the mask drawing data corresponding to a pattern group for modeling, the pattern group comprising a plurality of repetition patterns, the repetition patterns being obtained by changing first and second dimensions of a repetition pattern which repeats a basic pattern, the first dimension defining the basic pattern, and the second dimension defining repetition of the basic pattern, and the predetermined repetition pattern including a basic pattern corresponding to a pattern which is to be formed on a wafer and has a predetermined dimension; and
judging whether or not a dimension difference between an actual dimension of a portion of a photo mask corresponding to the predetermined mask drawing data and a target dimension falls in a first allowable range in a photo mask manufacturing step, judging whether or not a dimension difference between an actual dimension of a portion of a photo resist corresponding to the predetermined mask drawing data and a target dimension falls in a second allowable range in a lithography step, and judging whether or not a dimension difference between an actual dimension of a portion of a pattern on the wafer corresponding to the predetermined mask drawing data and a target dimension falls in a third allowable range in a processing step.

7. The method of managing the steps according to claim 6, wherein the basic pattern is a line pattern or a space pattern, the repetition pattern is a line & space pattern, the first dimension is a width of the line pattern or the space pattern, and the second dimension is a pitch of the line & space pattern.

8. The method of managing the steps according to claim 6, wherein the first, second, and third allowable ranges are equal, or two or more ranges of the first to third allowable ranges are equal.

9. The method of managing the steps according to claim 8, wherein the first, second, and third allowable ranges are set based on a first dimension fluctuation generated in the step of preparing the mask drawing data, a second dimension fluctuation generated in the step of manufacturing the photo mask, a third dimension fluctuation generated in the lithography step, and a fourth dimension fluctuation generated in the processing step.

10. The method of managing the steps according to claim 9, wherein the first to fourth dimension fluctuations are weighted.

11. The method of managing the steps according to claim 6, wherein the first dimension is $n\Delta x$ (n is a natural numeral), wherein $\Delta x$ is a minimum data grid of a drawing apparatus used in the photo mask manufacturing step.

12. The method of managing the steps according to claim 6, further comprising:
performing a process proximity effect correction for at least one step selected from a group consisting of the photo mask manufacturing step, the mask drawing data preparing step and the processing step, and the at least one step does not fall in the allowable range.

13. A method of managing process steps comprising:
preparing a pattern group comprising a plurality of repetition patterns, the plurality of repetition patterns being obtained by changing first and second dimensions of a repetition pattern which repeats a basic pattern, the first dimension defining the basic pattern, and the second dimension defining repetition of the basic pattern;
selecting at least one repetition patterns from the pattern group;
obtaining a first difference which is a difference between an actual value and a target value of a control value of a first step relating to a forming of the selected at least one repetition patterns; and
setting a first allowable range which is an allowable range of the first difference based on a predetermined second allowable range, the second allowable range being an allowable range between an actual value and a target value of a control value of a second step relating to a forming of the selected at least one repetition patterns, the forming being performed after the first step.

14. The method of managing the steps according to claim 13, wherein the basic pattern is a line pattern or a space pattern, the repetition pattern is a line & space pattern, the first dimension is a width of the line pattern or the space pattern, and the second dimension is a pitch of the line & space pattern.

15. The method of managing the steps according to claim 13, wherein the basic pattern is a line pattern, a space pattern, a hole pattern, or a dot pattern, the first dimension is a width of the line pattern, a width of the space pattern, a diameter of the hole pattern, or a diameter of the dot pattern, and the second dimension is a pitch of the line & space pattern, a pitch of the hole pattern, or a pitch of the dot pattern.

16. The method of managing the steps according to claim 13, wherein a combination of the first and second steps is a combination of a step of forming mask drawing data and a step of manufacturing a photo mask, the step of forming the mask drawing data and a lithography step, the step of forming the mask drawing data and a processing step, a step of manufacturing a photo mask and the lithography step, the step of manufacturing the photo mask and the processing step, or the lithography step and the processing step.

17. The method of managing the steps according to claim 13, wherein the setting the first allowable range includes obtaining a second difference which is the difference between the actual value and the target value of the second step; obtaining a first ratio which is a ratio of the second difference to the first difference; and setting the first allowable range based on the first ratio.

18. A method of managing process steps comprising:
preparing a pattern group comprising a plurality of repetition patterns, the plurality of repetition patterns being obtained by changing first and second dimensions of a repetition pattern of a basic pattern, the first dimension defining the basic pattern, and the second dimension defining repetition of the basic pattern;
selecting at least one repetition pattern from the pattern group;
obtaining a first difference which is a difference between an actual value and a target value of a control value of a step of forming mask drawing data relating to a forming of the selected at least one repetition patterns;
obtaining a second difference which is a difference between an actual value and a target value of a control value of a step of manufacturing a photo mask relating to a forming of the selected at least one repetition patterns;
obtaining a first ratio which is a ratio of the second difference to the first difference;
setting a first allowable range which is an allowable range of the first difference based on the first ratio and a predetermined second allowable range which is an allowable range of the second difference;
obtaining a third difference which is a difference between an actual value and a target value of a control value of a lithography step relating to a forming of the selected at least one repetition patterns;
obtaining a second ratio which is a ratio of the third difference to the second difference;
setting a second allowable range which is an allowable range of the second difference based on the second ratio and a predetermined third allowable range which is an allowable range of the third difference;
obtaining a fourth difference which is a difference between an actual value and a target value of a control value of a processing step relating to a forming of the selected at least one repetition patterns;
obtaining a third ratio which is a ratio of the fourth difference to the third difference;
setting a third allowable range which is an allowable range of the third difference based on the third ratio and a preset fourth allowable range which is an allowable range of the fourth difference; and
setting a fourth allowable range which is an allowable range of the difference between the actual value and the target value of the processing step.

19. The method of managing the steps according to claim 18, wherein the first, second, third, and fourth difference allowable ranges are set in a range which satisfies
$\Delta CDtotal = W1 \cdot R0 \cdot R1 \cdot R2 \cdot \Delta CDdata + W1 \cdot R1 \cdot R2 \cdot \Delta CDmask + W3 \cdot R2 \cdot \Delta CDlitho + W4 \cdot \Delta CDetch$, where:

$\Delta CDtotal$: an allowable range of a difference between an actual value and a target value of an evaluation value of a pattern on a wafer obtained through the step of preparing the mask drawing data, the step of manufacturing the photo mask, the lithography step, and the processing step;
$\Delta CD_{data}$: the first allowable range;
$\Delta CD_{mask}$: the second allowable range;
$\Delta CDlitho$: the third allowable range;
$\Delta CDetch$: the fourth allowable range;
R0: a ratio of the second difference to the first difference;
R1: a ratio of the third difference to the second difference;
R2: a ratio of the fourth difference to the third difference;
W1: a first weight coefficient;
W2: a second weight coefficient;
W3: a third weight coefficient; and
W4: a fourth weight coefficient.

20. The method of managing the steps according to claim 6, further comprising:
calculating a correlation coefficient of a dimension difference between the step of forming the mask drawing data and the step of manufacturing the photo mask, a correlation coefficient of a dimension difference between the step of manufacturing the photo mask and the lithography step, and a correlation coefficient of a dimension difference between the lithography step and the processing step.

21. The method of managing the steps according to claim 13, further comprising:
calculating a correlation coefficient of a dimension difference between the first and second steps; and setting the second allowable range based on the correlation coefficient previously.

22. A method of manufacturing a semiconductor device comprising:
managing process steps of manufacturing the semiconductor device by a method of managing process steps according to any one of claims 13 to 21; and
performing the managed manufacturing step.

23. A method of manufacturing a photo mask, comprising:
managing process steps of manufacturing the photo mask by a method of managing process steps according to any one of claims 13 to 21; and
performing the managed manufacturing steps.

24. A computer program product configured to store program instructions for execution on a computer system enabling the computer system to perform:
inputting a step; and
managing the step by a method of managing process steps according to any one of claims 13 to 21.

* * * * *